(12) United States Patent
Ito et al.

(10) Patent No.: US 9,209,267 B2
(45) Date of Patent: Dec. 8, 2015

(54) METHOD FOR FORMING OXIDE SEMICONDUCTOR FILM AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Daigo Ito, Isehara (JP); Yuichi Sato, Isehara (JP); Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/734,492

(22) Filed: Jun. 9, 2015

(65) Prior Publication Data

US 2015/0311074 A1    Oct. 29, 2015

Related U.S. Application Data

(62) Division of application No. 13/686,204, filed on Nov. 27, 2012.

(30) Foreign Application Priority Data

Nov. 30, 2011   (JP) ................................. 2011-262636

(51) Int. Cl.
*H01L 21/265*   (2006.01)
*H01L 29/66*   (2006.01)
(Continued)

(52) U.S. Cl.
CPC .... *H01L 29/66477* (2013.01); *H01L 21/02565* (2013.01); *H01L 21/265* (2013.01); *H01L 29/66969* (2013.01); *H01L 29/7869* (2013.01)

(58) Field of Classification Search
CPC ............ H01L 29/41733; H01L 29/786; H01L 29/78618; H01L 29/7869; H01L 29/66969; H01L 21/02565; H01L 21/265
See application file for complete search history.

(56) References Cited

U.S. PATENT DOCUMENTS 5,528,032 A   6/1996  Uchiyama
5,731,856 A   3/1998  Kim et al.
(Continued)

FOREIGN PATENT DOCUMENTS

EP   1737044 A   12/2006
EP   2226847 A    9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Allen Parker
(74) *Attorney, Agent, or Firm* — Eric J. Robinson; Robinson Intellectual Property Law Office, P.C.

(57) ABSTRACT

An oxide semiconductor film is formed over a substrate. A sacrifice film is formed to such a thickness that the local maximum of the concentration distribution of an injected substance injected into the oxide semiconductor film in the depth direction of the oxide semiconductor film is located in a region from an interface between the substrate and the oxide semiconductor film to a surface of the oxide semiconductor film. Oxygen ions are injected as the injected substance into the oxide semiconductor film through the sacrifice film at such an acceleration voltage that the local maximum of the concentration distribution of the injected substance in the depth direction of the oxide semiconductor film is located in the region, and then the sacrifice film is removed. Further, a semiconductor device is manufactured using the oxide semiconductor film.

13 Claims, 18 Drawing Sheets

(51) Int. Cl.
   *H01L 21/02*         (2006.01)
   *H01L 29/786*        (2006.01)

(56) References Cited

U.S. PATENT DOCUMENTS

| | | |
|---|---|---|
| 5,744,864 A | 4/1998 | Cillessen et al. |
| 5,990,542 A | 11/1999 | Yamazaki |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,753,229 B1 | 6/2004 | King et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,151,015 B2 | 12/2006 | Suzawa et al. |
| 7,161,177 B2 | 1/2007 | Suzawa et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,705,358 B2 | 4/2010 | Okamoto et al. |
| 7,732,819 B2 | 6/2010 | Akimoto et al. |
| 7,767,505 B2 | 8/2010 | Son et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0111424 A1 | 5/2007 | Suzawa et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0272927 A1 | 11/2007 | Takeguchi et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0140613 A1 | 6/2010 | Kimura |
| 2010/0181575 A1 | 7/2010 | Makita et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0136301 A1 | 6/2011 | Yamazaki et al. |
| 2011/0163311 A1 | 7/2011 | Akimoto et al. |
| 2011/0212569 A1 | 9/2011 | Yamazaki et al. |
| 2011/0237025 A1 | 9/2011 | Yamazaki |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0269266 A1 | 11/2011 | Yamazaki |
| 2011/0281394 A1 | 11/2011 | Yamazaki |
| 2012/0051117 A1 | 3/2012 | Yamazaki et al. |
| 2012/0146019 A1 | 6/2012 | Yamazaki et al. |
| 2012/0149147 A1 | 6/2012 | Yamazaki et al. |
| 2012/0153277 A1* | 6/2012 | Yaginuma et al. ............. 257/43 |
| 2012/0276694 A1 | 11/2012 | Koezuka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| | | |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-199272 A | 10/2011 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-gel-Derived Zinc Oxide Films by Irradiation With Ultraviolet Lamp", Journal of Sol-gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase—, Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Parks et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous—In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Techical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. App. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-12102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Moon.Y et al., "Application of DC Magnetron Sputtering to Deposition of InGaZnO Films for Thin Film Transistor Devices", Jpn. J. Appl. Phys. (Japanese Journal of Applied Physics), 2009, vol. 48, pp. 031301-1-031301-4.

\* cited by examiner

METHOD FOR FORMING OXIDE SEMICONDUCTOR FILM AND METHOD FOR MANUFACTURING SEMICONDUCTOR DEVICE

BACKGROUND OF THE INVENTION

1. Field of the Invention

The present invention relates to a method for forming an oxide semiconductor film or an insulating film, and to a method for manufacturing a semiconductor device with the use of the oxide semiconductor film or the insulating film.

Note that a semiconductor device in this specification refers to general devices which can function by utilizing semiconductor characteristics; for example, a semiconductor element such as a transistor, a semiconductor circuit including a semiconductor element, an electro-optical device such as a display device, and an electronic device are all semiconductor devices.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that, in this specification, a metal oxide exhibiting semiconductor characteristics is referred to as an oxide semiconductor.

For example, a technique is disclosed in which a transistor is manufactured using zinc oxide or an In—Ga—Zn—O-based oxide as an oxide semiconductor and the transistor is used as a switching element or the like of a pixel of a display device (see Patent Documents 1 and 2). Further, concerning a transistor using an oxide semiconductor, a technique in which oxygen is introduced into an oxide semiconductor by an ion implantation method or an ion doping method is disclosed (see Patent Document 3).

REFERENCE

[Patent Document 1] Japanese Published Patent Application No. 2007-123861

[Patent Document 2] Japanese Published Patent Application No. 2007-96055

[Patent Document 3] Japanese Published Patent Application No. 2011-199272

SUMMARY OF THE INVENTION

However, in an oxide semiconductor, charge is generated owing to an oxygen vacancy caused therein. Part of oxygen vacancies in the oxide semiconductor serves as a donor to generate an electron that is a carrier. Therefore, the threshold voltage of a transistor in which an oxide semiconductor is used for an active layer including a channel formation region (hereinafter referred to as a transistor using an oxide semiconductor) is easily shifted in the negative direction because of oxygen vacancies in the oxide semiconductor, and the transistor is likely to have normally-on characteristics.

Thus, in order to obtain favorable transistor characteristics of the transistor using an oxide semiconductor, oxygen vacancies in the oxide semiconductor are preferably filled (or compensated for). For the filling of the oxygen vacancies in the oxide semiconductor, the oxygen vacancies in the oxide semiconductor may be compensated for with externally supplied oxygen. For example, the oxygen vacancies in the oxide semiconductor can be filled by injecting oxygen ions by an ion implantation method or an ion doping method.

Furthermore, in the transistor using an oxide semiconductor, the thickness of the active layer (oxide semiconductor) is reduced in some cases so that an electric field from a gate electrode is sufficiently applied to the active layer. In the case where oxygen ions are injected into an oxide semiconductor film by an ion implantation method or an ion doping method, the oxygen ions need to be injected at a low acceleration voltage so as to be injected accurately at a desired injection concentration.

As the acceleration voltage is lowered, a beam current generated by a space-charge effect decreases and longer time is needed to inject oxygen ions. Further, as the acceleration voltage is lowered, the concentration distribution of the injected oxygen ions has a more distinct local maximum with a larger concentration gradient in the depth direction of the oxide semiconductor. Consequently, the lowering of the acceleration voltage for oxygen ion injection leads to a non-uniform concentration of the injected oxygen ions in the depth direction of the oxide semiconductor, and thus, oxygen vacancies might not be sufficiently filled.

In short, in the transistor using an oxide semiconductor, there is a possibility that injection of oxygen ions into the oxide semiconductor at a low acceleration voltage cannot achieve sufficient filling of oxygen vacancies, resulting in insufficient correction of the normally-on characteristics.

In view of the above, an object of one embodiment of the present invention is to provide a method for forming an oxide semiconductor film into which oxygen ions are uniformly injected. Another object of one embodiment of the present invention is to provide a method for manufacturing a semiconductor device having favorable electrical characteristics with the use of the oxide semiconductor film.

In general, as the acceleration voltage is raised, the concentration gradient of an injected substance in the depth direction of an injection target becomes smaller and the concentration distribution of the injected substance comes closer to a uniform distribution (substantially uniform distribution) in the depth direction. In other words, the concentration gradient of the injected substance becomes gentler. However, as the acceleration voltage is raised, the local maximum of the concentration distribution of the injected substance is shifted in the depth direction of the injection target. Therefore, in the case where the thickness of the injection target is small, it is difficult to inject oxygen ions properly into a desired injection position. Note that a "concentration distribution" in this specification means a "dose profile" and can be replaced with the term "dose profile" as appropriate.

In one embodiment of the present invention, a sacrifice film is formed over an oxide semiconductor film so that the local maximum of the concentration distribution of an injected substance in the depth direction of an injection target is located in a region of the oxide semiconductor film, and oxygen ions are injected as the injected substance into the oxide semiconductor film at a high acceleration voltage so that the local maximum of the depth-direction concentration distribution of the injected substance injected into the oxide semiconductor film is located in the region.

One embodiment of the present invention is a method for forming an oxide semiconductor film including the steps of forming an oxide semiconductor film over a substrate; forming a sacrifice film having such a thickness that the local maximum of the concentration distribution of an injected substance injected into the oxide semiconductor film in the depth direction of the oxide semiconductor film is located in a region from an interface between the substrate and the oxide semiconductor film to a surface of the oxide semiconductor film; and injecting oxygen ions as the injected substance into the oxide semiconductor film through the sacrifice film at such an acceleration voltage that the local maximum of the concentration distribution of the injected substance in the depth direction of the oxide semiconductor film is located in the region, and then removing the sacrifice film.

In the above embodiment, the oxide semiconductor film can be formed to a thickness greater than or equal to 5 nm and less than or equal to 50 nm, and the sacrifice film can be formed to a thickness greater than or equal to 20 nm and less than or equal to 500 nm.

Oxygen vacancies in an oxide semiconductor can be filled not only by direct injection of oxygen ions into the oxide semiconductor, for example, by an ion implantation method or an ion doping method, but also by formation of an oxide semiconductor film over an insulating film containing oxygen. In the latter case, the oxide semiconductor film is preferably subjected to heat treatment while being in contact with the insulating film.

When oxygen is contained in the insulating film uniformly in the depth direction of the insulating film, oxygen is uniformly injected from the insulating film into the oxide semiconductor film, so that oxygen vacancies can be sufficiently filled.

That is, one embodiment of the present invention can be applied not only to an oxide semiconductor film but also to an insulating film. Specifically, it is possible to form a sacrifice film so that the local maximum of the concentration distribution of an injected substance in the depth direction of an insulating film is located in a region of the insulating film, particularly in the vicinity of a surface of the insulating film, and to inject oxygen ions into the insulating film at a high acceleration voltage so that the local maximum of the depth-direction concentration distribution of the injected substance injected into the insulating film is located in the region or in the vicinity of the surface of the insulating film.

In one embodiment of the present invention, an insulating film is formed over a substrate; a sacrifice film having such a thickness that the local maximum of the depth-direction concentration distribution of an injected substance injected into the insulating film is located in a region from an interface between the substrate and the insulating film to a surface of the insulating film; oxygen ions are injected into the insulating film through the sacrifice film at such an acceleration voltage that the local maximum of the concentration distribution of the injected substance in the depth direction of the insulating film is located in the region, and then the sacrifice film is removed; and an oxide semiconductor film is formed over the insulating film over which the sacrifice film is removed.

In the above embodiment, the insulating film can be formed to a thickness greater than or equal to 5 nm and less than or equal to 500 nm, and the sacrifice film can be formed to a thickness greater than or equal to 20 nm and less than or equal to 500 nm.

An oxide semiconductor film or an insulating film is formed by the above method, whereby the amount of change in the concentration distribution of the injected substance in the depth direction of the oxide semiconductor film or the insulating film can be 40% or less on the basis of the concentration at the local maximum of the concentration distribution of the injected substance.

In the above embodiment, the acceleration voltage at which the oxygen ions are injected is changed depending on the density and thickness of the injection target; therefore, the injection is performed at such an acceleration voltage that the local maximum of the concentration distribution of the injected substance in the depth direction of the injection target can be located in a region of a film formed under the sacrifice film. In general, as described above, the local maximum of the concentration distribution of an injected substance in the depth direction of an injection target is shifted in the depth direction by raising the acceleration voltage; therefore, the acceleration voltage is preferably high.

In the above embodiment, the sacrifice film can be removed by any one of wet etching, dry etching, and a chemical mechanical polishing method.

In the above embodiment, the sacrifice film can be formed using a material that is the same as or different from that for the film formed under the sacrifice film. By forming the sacrifice film with the use of a material that is different from that for the film formed under the sacrifice film, the sacrifice film can be easily removed by utilizing etching selectivity at the removal of the sacrifice film. By forming the sacrifice film with the use of the same material as the film formed under the sacrifice film, the time taken to form the film of one embodiment of the present invention can be shortened, and impurities which might be attached to the film formed under the sacrifice film in the case where the sacrifice film is formed using a material that is different from that for the film formed under the sacrifice film can be reduced.

In the manufacture of a transistor using an oxide semiconductor, at least an oxide semiconductor film functioning as a channel formation region can be formed by the above method for forming an oxide semiconductor film.

One embodiment of the present invention is a method for manufacturing a semiconductor device including the steps of forming an oxide semiconductor film over a substrate having an insulating surface; forming a sacrifice film having such a thickness that the local maximum of the concentration distribution of an injected substance injected into the oxide semiconductor film in the depth direction of the oxide semiconductor film is located in a region from an interface between the substrate and the oxide semiconductor film to a surface of the oxide semiconductor film; injecting oxygen ions as the injected substance into the oxide semiconductor film through the sacrifice film at such an acceleration voltage that the local maximum of the concentration distribution of the injected substance in the depth direction of the oxide semiconductor film is located in the region, and then removing the sacrifice film; forming an island-shaped oxide semiconductor film by processing the oxide semiconductor film into which the oxygen ions have been injected; forming a gate insulating film over the island-shaped oxide semiconductor film; forming a gate electrode over the gate insulating film so as to overlap with the island-shaped oxide semiconductor film with the gate insulating film positioned between the gate electrode and the island-shaped oxide semiconductor film; partly exposing the island-shaped oxide semiconductor film by processing the gate insulating film; and forming a source electrode and a drain electrode over the partly exposed island-shaped oxide semiconductor film.

In the manufacture of a transistor using an oxide semiconductor, a base insulating film or the like of the transistor can be formed by the above method for forming an insulating film.

One embodiment of the present invention is a method for manufacturing a semiconductor device including the steps of forming a base insulating film over a substrate; forming a sacrifice film having such a thickness that the local maximum of the concentration distribution of an injected substance injected into the base insulating film in the depth direction of the base insulating film is located in a region from an interface between the substrate and the base insulating film to a surface of the base insulating film; injecting oxygen ions as the injected substance into the base insulating film through the sacrifice film at such an acceleration voltage that the local maximum of the concentration distribution of the injected substance in the depth direction of the base insulating film is located in the region, and then removing the sacrifice film; forming an oxide semiconductor film over the base insulating film into which the oxygen ions have been injected; forming an island-shaped oxide semiconductor film by processing the oxide semiconductor film; forming a gate insulating film over the island-shaped oxide semiconductor film; forming a gate electrode over the gate insulating film so as to overlap with the island-shaped oxide semiconductor film with the gate insulating film positioned between the gate electrode and the island-shaped oxide semiconductor film; partly exposing the island-shaped oxide semiconductor film by processing the gate insulating film; and forming a source electrode and a drain electrode over the partly exposed island-shaped oxide semiconductor film.

Further, when the local maximum of the oxygen ion concentration distribution is located in the vicinity of the surface of the base insulating film, the distance which the oxygen ion travels to the oxide semiconductor film formed over the base insulating film can be shortened; thus, oxygen vacancies in the oxide semiconductor film can be effectively filled. Accordingly, a transistor having favorable electrical characteristics can be manufactured.

When oxygen ions are injected into an injection target such as an oxide semiconductor film or an insulating film by an ion implantation method or an ion doping method, not only the injected oxygen ions but also impurities attached to the injection target are put into the injection target owing to a knock-on effect. If a transistor is manufactured using such an injection target including impurities, the transistor might have unfavorable electrical characteristics. In contrast, by forming a sacrifice film, and then injecting oxygen ions and removing the sacrifice film as in one embodiment of the present invention, impurities included in an injection target can be reduced, and thus, a transistor having favorable electrical characteristics can be manufactured.

According to one embodiment of the present invention, a method for forming an oxide semiconductor film into which oxygen ions are uniformly injected can be provided. Furthermore, according to one embodiment of the present invention, a method for manufacturing a semiconductor device having favorable electrical characteristics with the use of the oxide semiconductor film can be provided.

DETAILED DESCRIPTION OF THE INVENTION

Figure 1A:
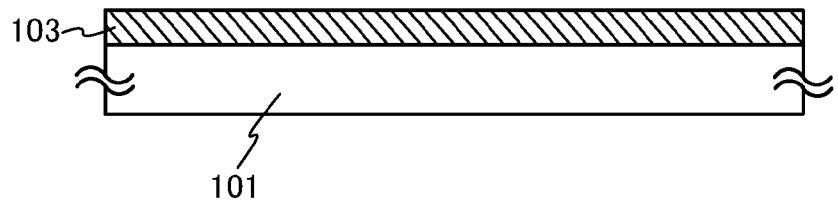
FIGS. 1A to 1E are cross-sectional views illustrating a method for forming an oxide semiconductor film.

Hereinafter, embodiments and examples of the present invention will be described in detail with reference to the accompanying drawings. Note that the present invention is not limited to the following description and it is easily understood by those skilled in the art that the modes and details of the present invention can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that, in each drawing in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Embodiment 1

In this embodiment, a method for forming an oxide semiconductor film in which oxygen is contained uniformly in the depth direction of the oxide semiconductor film is described with reference to FIGS. 1A to 1E and FIG. 16A. FIGS. 1A to 1E are schematic cross-sectional views illustrating a method for forming an oxide semiconductor film, which is one embodiment of the present invention.

First, an oxide semiconductor film 103 is formed over a substrate 101 (see FIG. 1A). The oxide semiconductor film 103 may be formed using any of metal oxide materials (oxide semiconductor materials) given below by a chemical vapor deposition (CVD) method, a sputtering method, a molecular beam epitaxy (MBE) method, or a pulsed laser deposition (PLD) method, and is preferably formed by a sputtering method.

The oxide semiconductor film 103 may have an amorphous structure or a crystalline structure.

For the oxide semiconductor film 103, a metal oxide material containing at least indium (In) or zinc (Zn) is preferably used. In particular, the metal oxide material preferably contains In and Zn.

Specific examples of a material for the oxide semiconductor film 103 are indium oxide, tin oxide, zinc oxide, an oxide material containing two kinds of metals, such as an In—Zn-based oxide material, a Sn—Zn-based oxide material, an Al—Zn-based oxide material, a Zn—Mg-based oxide material, a Sn—Mg-based oxide material, an In—Mg-based oxide material, or an In—Ga-based oxide material, an oxide material containing three kinds of metals, such as an In—Ga—Zn-based oxide material, an In—Al—Zn-based oxide material, an In—Sn—Zn-based oxide material, a Sn—Ga—Zn-based oxide material, an Al—Ga—Zn-based oxide material, a Sn—Al—Zn-based oxide material, an In—Hf—Zn-based oxide material, an In—La—Zn-based oxide material, an In—Ce—Zn-based oxide material, an In—Pr—Zn-based oxide material, an In—Nd—Zn-based oxide material, an In—Sm—Zn-based oxide material, an In—Eu—Zn-based oxide material, an In—Gd—Zn-based oxide material, an In—Tb—Zn-based oxide material, an In—Dy—Zn-based oxide material, an In—Ho—Zn-based oxide material, an In—Er—Zn-based oxide material, an In—Tm—Zn-based oxide material, an In—Yb—Zn-based oxide material, an In—Lu—Zn-based oxide material, or an In—Ni—Zn-based oxide material, and an oxide material containing four kinds of metals, such as an In—Sn—Ga—Zn-based oxide material, an In—Hf—Ga—Zn-based oxide material, an In—Al—Ga—Zn-based oxide material, an In—Sn—Al—Zn-based oxide material, an In—Sn—Hf—Zn-based oxide material, or an In—Hf—Al—Zn-based oxide material.

For example, an In—Ga—Zn-based oxide material means an oxide containing In, Ga, and Zn as main components and there is no limitation on the atomic ratio of In, Ga, and Zn.

In the case where an In—Zn-based oxide material is used for the oxide semiconductor film 103, the atomic ratio of In to Zn is greater than or equal to 0.5 and less than or equal to 50, preferably greater than or equal to 1 and less than or equal to 20, further preferably greater than or equal to 1.5 and less than or equal to 15. When the atomic ratio of In to Zn is in the above range, the field-effect mobility of a transistor using an oxide semiconductor can be improved. Here, when the atomic ratio of the compound is In:Zn:O=X:Y:Z, the relation of $Z>1.5X+Y$ is preferably satisfied.

A material represented by the chemical formula, $InMO_3(ZnO)_m$ (m>0) may be used for the oxide semiconductor film 103. Here, M represents one or more metal elements selected from Zn, Ga, Al, Mn, Sn, Hf, and Co. For example, Ga, Ga and Al, Ga and Mn, or Ga and Co may be used as M.

Figure 1B:
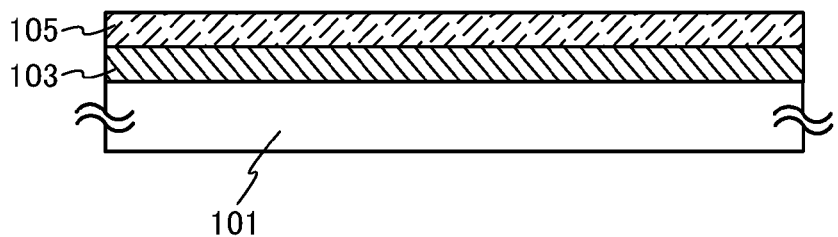

Next, a sacrifice film 105 is formed over the oxide semiconductor film 103 (see FIG. 1B). There is no particular limitation on the sacrifice film 105 as long as oxygen ions injected later can pass therethrough. For example, the sacrifice film 105 can be formed using a material that is the same as or different from that for the oxide semiconductor film 103 formed under the sacrifice film 105. Specific examples of a material that can be used for the sacrifice film 105 and is different from that for the oxide semiconductor film 103 are a metal oxide such as molybdenum oxide, cerium oxide, or magnesium oxide and an insulator such as silicon oxide. Here, a material that is different from that for the oxide semiconductor film 103 is used for the sacrifice film 105. Note that the case where the same material as the oxide semiconductor film 103 is used for the sacrifice film 105 is described later.

The sacrifice film 105 is provided in order to locate, at the time of injecting oxygen ions later, the local maximum of the oxygen ion concentration distribution in the depth direction of the oxide semiconductor film 103 in a region from an interface between the substrate 101 and the oxide semiconductor film 103 to an interface between the oxide semiconductor film 103 and the sacrifice film 105 (a surface of an oxide semiconductor film 109 described later).

The thickness of the sacrifice film 105 varies depending on the thickness of the oxide semiconductor film 103 or the acceleration voltage at which oxygen ions are injected later. For example, in the case where the thickness of the oxide semiconductor film 103 is greater than or equal to 5 nm and less than or equal to 50 nm, the sacrifice film 105 can be formed to a thickness greater than or equal to 20 nm and less than or equal to 500 nm. Note that the sacrifice film 105 can be formed by a method similar to that for the oxide semiconductor film 103.

Figure 1C:
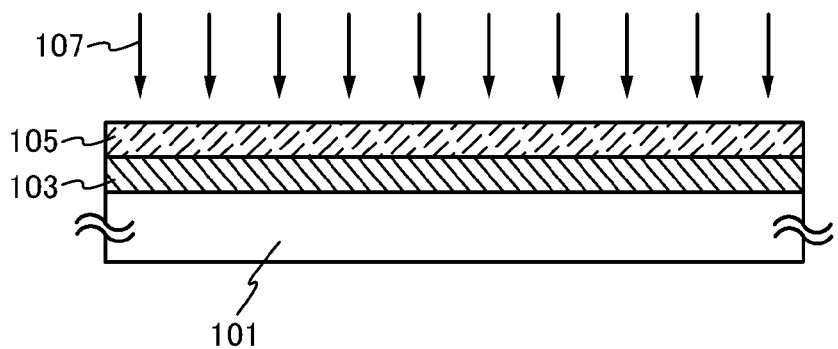

Next, oxygen ions 107 are injected into the oxide semiconductor film 103 through the sacrifice film 105 (see FIG. 1C). The oxygen ions 107 are injected into the oxide semiconductor film 103 and the sacrifice film 105, so that the oxide semiconductor film 109 and a sacrifice film 111 are formed (see FIG. 1D).

The oxygen ions 107 can be injected by an ion implantation method or an ion doping method. The acceleration voltage at which the oxygen ions 107 are injected is changed depending on the densities and thicknesses of the oxide semiconductor film 103 and the sacrifice film 105. Whichever method is employed, the injection is performed at such an acceleration voltage that the local maximum of the concentration distribution of the oxygen ions 107 is located in the region from the interface between the substrate 101 and the oxide semiconductor film 103 to a surface of the oxide semiconductor film 103. In other words, the injection is performed at a high acceleration voltage, considering the densities and thicknesses of the oxide semiconductor film 103 and the sacrifice film 105. Since the oxygen ions 107 are injected through the sacrifice film 105, the local maximum of the oxygen ion concentration distribution in the depth direction of the oxide semiconductor film 103 can be located in the region from the interface between the substrate 101 and the oxide semiconductor film 103 to the interface between the oxide semiconductor film 103 and the sacrifice film 105.

Figure 1D:
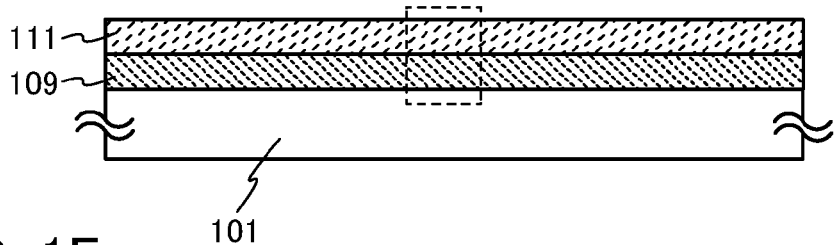
Figure 16A:
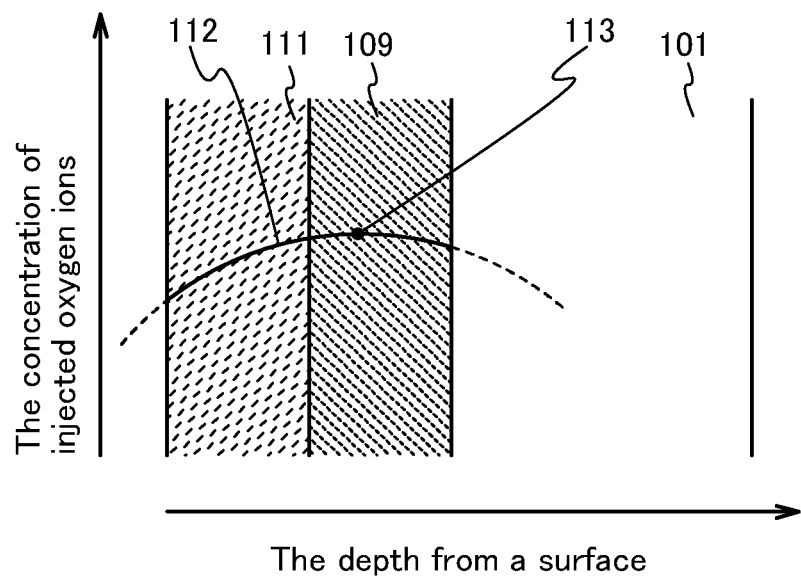
FIG. 16A is a diagram illustrating the concentration distribution of oxygen ions injected into the oxide semiconductor film in the steps of FIGS. 1A to 1E.

Here, FIG. 16A schematically illustrates the concentration distribution of the injected oxygen ions 107 in a region surrounded by dotted lines in FIG. 1D. Note that FIG. 16A is an enlarged view of the region surrounded by the dotted lines, where the horizontal axis represents the depth from a surface of the sacrifice film 111 and the vertical axis represents the concentration of the injected oxygen ions 107. Further, FIG. 16A illustrates the oxide semiconductor film 109 and the sacrifice film 111 over the substrate 101, and a concentration distribution 112 of the injected oxygen ions 107.

The oxygen ions 107 are injected through the sacrifice film 105 at a high acceleration voltage in the above manner, whereby a local maximum 113 of the concentration distribution 112 of the oxygen ions 107 can be located in the region from an interface between the substrate 101 and the oxide semiconductor film 109 to an interface between the oxide semiconductor film 109 and the sacrifice film 111.

In addition, the concentration gradient of the oxygen ions 107 injected in the above manner is gentle as indicated by the concentration distribution 112. That is, by injecting the oxygen ions 107 at a high acceleration voltage, the oxygen ions 107 can be injected so that the amount of change in the concentration distribution at least in the depth direction of the oxide semiconductor film 109 is small. Specifically, the amount of change in the concentration distribution in the depth direction of the oxide semiconductor film 109 can be 40% or less on the basis of the concentration at the local maximum 113 of the concentration distribution. Note that the injection of the oxygen ions 107 at a high acceleration voltage can also make the amount of change in the concentration distribution in the depth direction of the sacrifice film 111 small.

Moreover, by setting the acceleration voltage high as described above at the time of injecting the oxygen ions 107 into the oxide semiconductor film 103, the time taken to inject the oxygen ions 107 at a desired concentration can be shortened.

Since the oxygen ions 107 are injected to fill oxygen vacancies caused in the oxide semiconductor film 103, it is preferable that only oxygen ions be injected into the oxide semiconductor film 103. For this reason, the oxygen ions 107 are preferably injected by an ion implantation method, in which mass separation is performed.

Figure 1E:
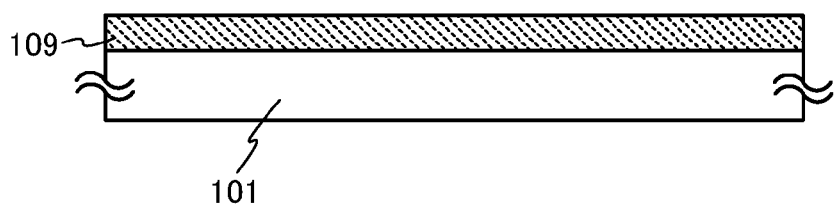

Next, the sacrifice film 111 is removed, so that the surface of the oxide semiconductor film 109 in which the local maximum of the oxygen ion concentration distribution in the depth direction of the film is located and the amount of change in the concentration distribution is small is exposed (see FIG. 1E). Since the above method enables the oxygen ions 107 to be injected into the oxide semiconductor film 103 uniformly in the depth direction, oxygen vacancies caused in the oxide semiconductor film 103 can be sufficiently filled. That is, the oxide semiconductor film 109 is an oxide semiconductor film in which oxygen vacancies are sufficiently filled.

The sacrifice film 111 can be removed by any one of wet etching, dry etching, and a chemical mechanical polishing method, and is preferably removed by wet etching because it is the easiest method.

Since the sacrifice film 111 is formed using a material that is different from that for the oxide semiconductor film 109, the sacrifice film 111 can be removed under a condition where the etching rates differ between the sacrifice film 111 and the oxide semiconductor film 109 (condition where the etching selectivity is high); thus, the sacrifice film 111 can be easily removed.

After the sacrifice film 105 is formed over the oxide semiconductor film 103, the oxygen ions 107 are injected and the sacrifice film 111 is removed, whereby impurities attached to the surface of the oxide semiconductor film 103 can be prevented from being put into the oxide semiconductor film 103 by a knock-on effect. As a result, impurities included in the oxide semiconductor film 109 can be reduced.

Alternatively, in this embodiment, the sacrifice film 105 may be formed using the same material as the oxide semiconductor film 103. Specifically, the oxide semiconductor film 109 may be formed in such a manner that a thick oxide semiconductor film 103 is formed to have a first region which is to be the oxide semiconductor film 109 in the end and a second region functioning as the sacrifice film 105, oxygen ions are injected through the second region at a high acceleration voltage, and the second region functioning as the sacrifice film 105 is removed. In the case where the thickness of the first region is greater than or equal to 5 nm and less than or equal to 50 nm, the thickness of the second region may be greater than or equal to 20 nm and less than or equal to 500 nm.

Also in the case where the sacrifice film 105 is formed using the same material as the oxide semiconductor film 103, by injecting oxygen ions into the first region through the second region at a high acceleration voltage, the oxygen ions are injected so that the amount of change in the concentration distribution at least in the depth direction of the first region is small. Then, the second region into which the oxygen ions have been injected is removed by any one of wet etching, dry etching, and a chemical mechanical polishing method; thus, the oxide semiconductor film 109 in which the amount of change in the concentration distribution in the depth direction of the first region is small can be formed. Note that, at the removal of the second region functioning as the sacrifice film 105, the etching rate of the first region is equal to that of the second region (the etching selectivity is low); therefore, it is preferable that the time for removal of the second region be controlled in consideration of the thickness and etching rate of the second region.

Further, in the case where the sacrifice film 105 is formed using a material that is different from that for the oxide semiconductor film 103, impurities generated in the formation of the sacrifice film 105 might be attached to the interface between the oxide semiconductor film 103 and the sacrifice film 105, and these impurities might remain on the surface of the oxide semiconductor film 109 obtained in the end. However, formation of the sacrifice film 105 using the same material as the oxide semiconductor film 103 can reduce impurities remaining on the surface of the oxide semiconductor film 109 obtained in the end. Moreover, the time taken to form the oxide semiconductor film of one embodiment of the present invention can be shortened.

As described above, in the case where oxygen ions are injected into a thin oxide semiconductor film, a sacrifice film is formed over the oxide semiconductor film and the oxygen ions are injected at a high acceleration voltage as in one embodiment of the present invention; consequently, an oxide semiconductor film into which the oxygen ions are uniformly injected and in which oxygen vacancies are sufficiently filled can be formed. Moreover, according to one embodiment of the present invention, the time taken to inject the oxygen ions into the oxide semiconductor film can be shortened, and the oxide semiconductor film into which the oxygen ions are uniformly injected and in which oxygen vacancies are sufficiently filled can be formed with higher productivity.

In the method for forming an oxide semiconductor film in this embodiment, an oxide semiconductor film is formed over a substrate; alternatively, an insulating film may be formed over a substrate and then an oxide semiconductor film may be formed over the insulating film. In this case, the local maximum of the concentration distribution of injected oxygen ions in the depth direction of the oxide semiconductor film is located in a region from an interface between the insulating film and the oxide semiconductor film to a surface of the oxide semiconductor film, and the amount of change in the concentration distribution in the depth direction of the oxide semiconductor film is small.

Note that the structures, methods, and the like described in this embodiment can be used as appropriate in combination with any of the structures, methods, and the like described in the other embodiments and examples.

Embodiment 2

In this embodiment, a method for forming an insulating film in which oxygen is contained uniformly in the depth direction of the insulating film is described with reference to FIGS. 2A to 2E and FIG. 16B. FIGS. 2A to 2E are schematic cross-sectional views illustrating a method for forming an insulating film, which is one embodiment of the present invention.

Figure 2A:
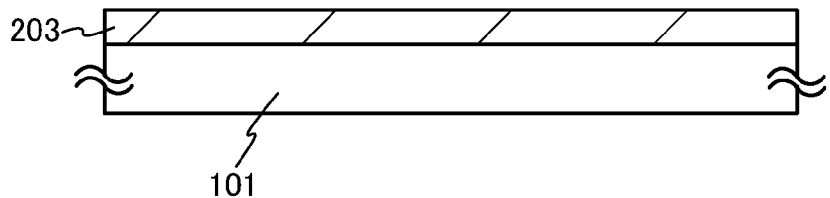
FIGS. 2A to 2E are cross-sectional views illustrating a method for forming an insulating film.

First, an insulating film 203 is formed over the substrate 101 (see FIG. 2A). The insulating film 203 may be formed by a CVD method, a sputtering method, an MBE method, or a PLD method.

There is no particular limitation on the insulating film 203 as long as it is an insulator. For example, an oxide insulating film of silicon oxide or the like, a nitride insulating film of silicon nitride or the like, an oxynitride insulating film of silicon oxynitride or the like, or a nitride oxide insulating film of silicon nitride oxide or the like can be used.

Note that silicon oxynitride refers to a substance that contains more oxygen than nitrogen. For example, silicon oxynitride contains oxygen, nitrogen, silicon, and hydrogen in ranges of 50 at.% to 70 at.%, 0.5 at.% to 15 at.%, 25 at.% to 35 at.%, and 0 at.% to 10 at.%, respectively. Further, silicon nitride oxide refers to a substance that contains more nitrogen than oxygen. For example, silicon nitride oxide contains oxygen, nitrogen, silicon, and hydrogen in ranges of 5 at.% to 30 at.%, 20 at.% to 55 at.%, 25 at.% to 35 at.%, and 10 at.% to 25 at.%, respectively. Note that the above ranges are ranges for cases where measurement is performed using Rutherford backscattering spectrometry (RBS) or hydrogen forward scattering spectrometry (HFS). Moreover, the total of the percentages of the constituent elements does not exceed 100 at.%.

Figure 2B:
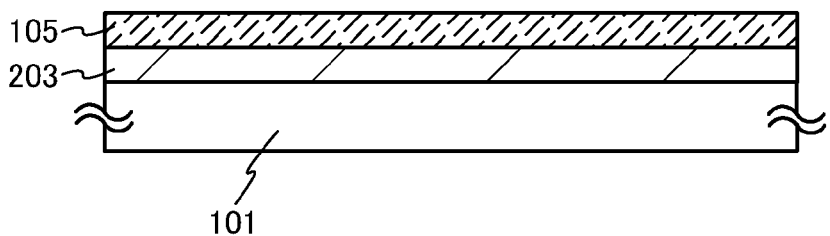

Next, the sacrifice film 105 is formed over the insulating film 203 (see FIG. 2B). The sacrifice film 105 is provided in order to locate, at the time of injecting oxygen ions later, the local maximum of the concentration distribution in the depth direction of the insulating film 203 in a region from an interface between the substrate 101 and the insulating film 203 to a surface of the insulating film 203 (corresponding to an interface between the insulating film 203 and the sacrifice film 105 in FIG. 2B), particularly in the vicinity of the surface of the insulating film 203.

The sacrifice film 105 may be formed using a material that is the same as or different from that for the insulating film 203 formed under the sacrifice film 105. For example, the sacrifice film 105 can be formed using a metal oxide such as molybdenum oxide, cerium oxide, or magnesium oxide or an insulating film that can be used for the insulating film 203. Here, a material that is different from that for the insulating film 203 is used for the sacrifice film 105. The case where the same material as the insulating film 203 is used for the sacrifice film 105 is described later.

The thickness of the sacrifice film 105 varies depending on the thickness of the insulating film 203 or the acceleration voltage at which oxygen ions are injected later. For example, in the case where the thickness of the insulating film 203 is greater than or equal to 5 nm and less than or equal to 500 nm, the sacrifice film 105 can be formed to a thickness greater than or equal to 20 nm and less than or equal to 500 nm. Note that the sacrifice film 105 may be formed by a method similar to that in Embodiment 1.

Figure 2C:
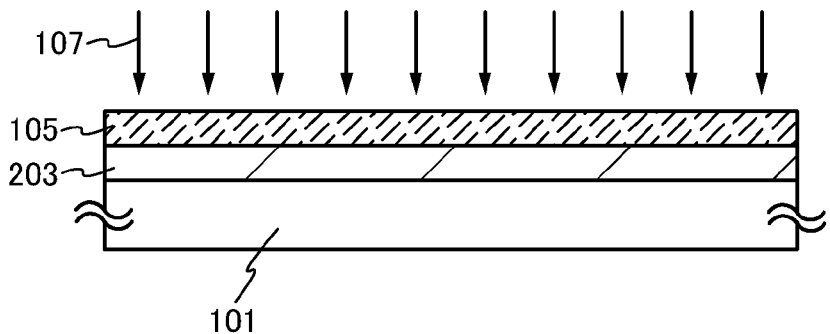

Next, the oxygen ions 107 are injected into the insulating film 203 through the sacrifice film 105 (see FIG. 2C). The oxygen ions 107 are injected into the insulating film 203 and the sacrifice film 105, so that an insulating film 205 and the sacrifice film 111 are formed (see FIG. 2D).

The oxygen ions 107 can be injected by a method similar to that in Embodiment 1. That is, the injection is performed at such an acceleration voltage that the local maximum of the concentration distribution of the oxygen ions 107 is located in the region from the interface between the substrate 101 and the insulating film 203 to the surface of the insulating film 203, particularly in the vicinity of the surface of the insulating film 203. In other words, the oxygen ions 107 are injected into the insulating film 203 and the sacrifice film 105 at a high acceleration voltage. By injecting the oxygen ions 107 into the insulating film 203 through the sacrifice film 105 at a high acceleration voltage, the local maximum of the concentration distribution in the depth direction of the insulating film 203 can be located in the region from the interface between the substrate 101 and the insulating film 203 to the interface between the insulating film 203 and the sacrifice film 105 (a surface of the insulating film 205 described later), particularly in the vicinity of the surface of the insulating film 203 (in the vicinity of the surface of the insulating film 205 described later).

Figure 2D:
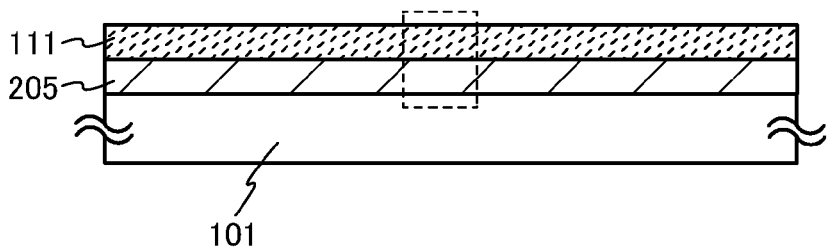
Figure 16B:
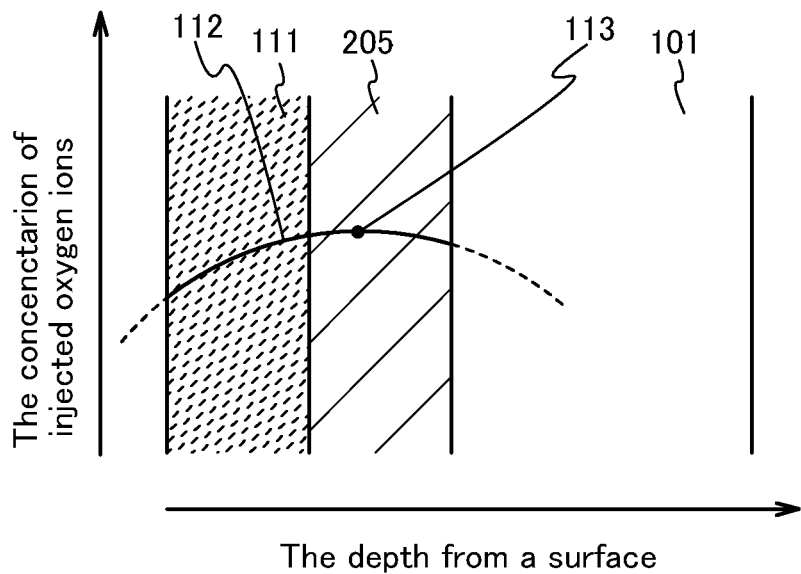
FIG. 16B is a diagram illustrating the concentration distribution of oxygen ions injected into the insulating film in the steps of FIGS. 2A to 2E.

Here, FIG. 16B schematically illustrates the concentration distribution of the injected oxygen ions 107 in a region surrounded by dotted lines in FIG. 2D. Note that FIG. 16B is an enlarged view of the region surrounded by the dotted lines, where the horizontal axis represents the depth from a surface of the sacrifice film 111 and the vertical axis represents the concentration of the injected oxygen ions 107. Further, FIG. 16B illustrates the insulating film 205 and the sacrifice film 111 over the substrate 101, and the concentration distribution 112 of the injected oxygen ions 107.

The oxygen ions 107 are injected through the sacrifice film 105 at a high acceleration voltage in the above manner, whereby the local maximum 113 of the concentration distribution 112 can be located in the region from an interface between the substrate 101 and the insulating film 205 to an interface between the insulating film 205 and the sacrifice film 111.

In addition, the concentration gradient of the oxygen ions 107 injected in the above manner is gentle as indicated by the concentration distribution 112. That is, the amount of change in the concentration distribution in the depth direction of the insulating film 205 can be small. Specifically, the amount of change in the concentration distribution in the depth direction of the insulating film 205 can be 40% or less on the basis of the concentration at the local maximum of the concentration distribution. Note that the injection of the oxygen ions 107 at a high acceleration voltage can also make the amount of change in the concentration distribution in the depth direction of the sacrifice film 111 small.

Also in this embodiment, the oxygen ions 107 are preferably injected by an ion implantation method, in which mass separation is performed.

Figure 2E:

Next, the sacrifice film 111 is removed, so that the surface of the insulating film 205 is exposed (see FIG. 2E).

As in Embodiment 1, the sacrifice film 111 can be removed by any one of wet etching, dry etching, and a chemical mechanical polishing method, and is preferably removed by wet etching because it is the easiest method.

In the case where the sacrifice film 111 is formed using a material that is different from that for the insulating film 205, the sacrifice film 111 can be removed under a condition where the etching rates differ between the sacrifice film 111 and the insulating film 205 (condition where the etching selectivity is high); thus, the sacrifice film 111 can be easily removed.

After the sacrifice film 105 is formed over the insulating film 203, the oxygen ions 107 are injected and the sacrifice film 111 is removed, whereby impurities attached to the surface of the insulating film 203 can be prevented from being put into the insulating film 203 by a knock-on effect. As a result, impurities included in the insulating film 205 can be reduced.

As described above, in this embodiment, the sacrifice film 105 may be formed using the same material as the insulating film 203. Specifically, the insulating film 205 may be formed in such a manner that a thick insulating film 203 is formed to have a first region which is to be the insulating film 205 in the end and a second region functioning as the sacrifice film 105, oxygen ions are injected through the second region at a high acceleration voltage, and the second region functioning as the sacrifice film 105 is removed. In the case where the thickness of the first region is greater than or equal to 5 nm and less than or equal to 500 nm, the thickness of the second region may be greater than or equal to 20 nm and less than or equal to 500 nm.

Also in the case where the sacrifice film 105 is formed using the same material as the insulating film 203, by injecting oxygen ions into the first region through the second region at a high acceleration voltage, the oxygen ions are injected so that the amount of change in the concentration distribution at least in the depth direction of the first region is small. Then, the second region into which the oxygen ions have been injected is removed by any one of wet etching, dry etching, and a chemical mechanical polishing method; thus, the insulating film 205 in which the amount of change in the concentration distribution in the depth direction of the first region is small can be formed. Note that, at the removal of the second region functioning as the sacrifice film 105, the etching rate of the first region is equal to that of the second region (the etching selectivity is low); therefore, it is preferable that the time for removal of the second region be controlled in consideration of the thickness and etching rate of the second region.

Further, in the case where the sacrifice film 105 is formed using a material that is different from that for the insulating film 203, impurities generated in the formation of the sacrifice film 105 might be attached to the interface between the insulating film 203 and the sacrifice film 105, and these impurities might remain on the surface of the insulating film 205 obtained in the end. However, formation of the sacrifice film 105 using the same material as the insulating film 203 can reduce impurities remaining on the surface of the insulating film 205 obtained in the end.

In the case where oxygen vacancies in an oxide semiconductor are filled by the method described in Embodiment 1, by the way, oxygen ions are directly injected into an oxide semiconductor film by an ion implantation method, an ion doping method, or the like. These methods might largely degrade the crystallinity of the oxide semiconductor film. Thus, an oxide semiconductor film is formed over the insulating film described in this embodiment and then heat treatment may be performed, whereby oxygen can be diffused from the insulating film into the oxide semiconductor film. Unlike in the case of the method described in Embodiment 1, oxygen ions are not directly injected into the oxide semiconductor film; therefore, oxygen vacancies can be filled without a large degradation in the crystallinity of the oxide semiconductor film.

Further, in the insulating film formed by the method described in this embodiment, the local maximum of the concentration distribution in the depth direction of the insulating film can be located close to the surface of the insulating film, and the amount of change in the concentration distribution can be small. Accordingly, when an oxide semiconductor film is formed over the insulating film, the distance which oxygen travels to the oxide semiconductor film can be shortened. Consequently, oxygen vacancies in the oxide semiconductor film formed over the insulating film can be efficiently filled.

As described above, in the case where oxygen ions are injected into a thin insulating film, a sacrifice film is formed over the insulating film and the oxygen ions are injected at a high acceleration voltage as in one embodiment of the present invention; consequently, an insulating film into which the oxygen ions are injected uniformly in the depth direction can be formed.

Note that the structures, methods, and the like described in this embodiment can be used as appropriate in combination with any of the structures, methods, and the like described in the other embodiments and examples.

Embodiment 3

In this embodiment, a method for manufacturing a semiconductor device with the use of the method for forming an oxide semiconductor film described in Embodiment 1 is described. Note that a transistor using an oxide semiconductor is described as an example of the semiconductor device in this embodiment. In addition, the method for forming an oxide semiconductor film described in Embodiment 1 can be applied to the manufacture of transistors having a variety of structures, such as a top-gate transistor, a bottom-gate transistor, and a dual-gate transistor; a top-gate transistor is described here as an example.

FIGS. 3A to 3D are schematic cross-sectional views illustrating a method for manufacturing a transistor using an oxide semiconductor in this embodiment.

First, the substrate 101 is prepared. Although there is no particular limitation on the substrate 101, it is preferable that the substrate 101 have an insulating surface and at least heat resistance high enough to withstand heat treatment performed later. For example, a glass substrate of aluminosilicate glass, aluminoborosilicate glass, barium borosilicate glass, or the like; a ceramic substrate; a quartz substrate; or a sapphire substrate can be used. Alternatively, a single crystal semiconductor substrate or a polycrystalline semiconductor substrate of silicon, silicon carbide, or the like; a compound semiconductor substrate of silicon germanium or the like; or the like can be used. Alternatively, a substrate obtained by forming an insulating film over a surface of a semiconductor substrate of silicon or the like or a surface of a conductive substrate formed of a metal material can be used. Note that a glass substrate is used as the substrate 101 in this embodiment.

A base insulating film may be provided over the substrate 101. In this embodiment, a base insulating film 303 is formed over the substrate 101.

There is no particular limitation on the base insulating film 303 as long as it is an insulator. For example, an oxide insulating film of silicon oxide or the like, a nitride insulating film of silicon nitride or the like, an oxynitride insulating film of silicon oxynitride or the like, or a nitride oxide insulating film of silicon nitride oxide or the like can be used. The base insulating film 303 may be formed by any one of a CVD method, a sputtering method, an MBE method, and a PLD method, and is preferably formed by a sputtering method.

The thickness of the base insulating film 303 may be greater than or equal to 5 nm and less than or equal to 500 nm; here, a 300-nm-thick oxide insulating film is formed.

Figure 3A:
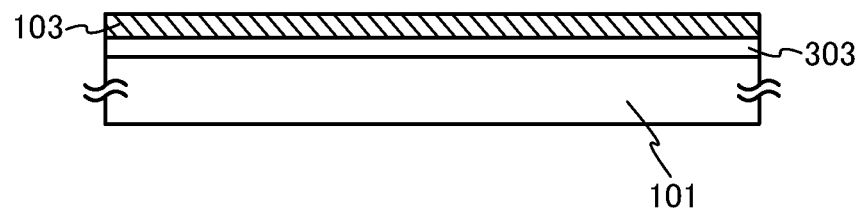
FIGS. 3A to 3D are cross-sectional views illustrating a method for manufacturing a transistor.

Next, the oxide semiconductor film 103 is formed over the base insulating film 303 (see FIG. 3A). The oxide semiconductor film 103 may be formed as in Embodiment 1. The thickness of the oxide semiconductor film 103 may be greater than or equal to 5 nm and less than or equal to 50 nm; in this embodiment, the oxide semiconductor film 103 is formed to a thickness of 20 nm.

Note that, in the case where an In—Zn-based oxide material is selected for the oxide semiconductor film 103 from the materials given in Embodiment 1, the atomic ratio of In to Zn is greater than or equal to 0.5 and less than or equal to 50, preferably greater than or equal to 1 and less than or equal to 20, further preferably greater than or equal to 1.5 and less than or equal to 15. When the atomic ratio of In to Zn is in the above range, the field-effect mobility of the transistor manufactured can be improved. Here, when the atomic ratio of the compound is In:Zn:O=X:Y:Z, the relation of Z>1.5X+Y is preferably satisfied.

It is preferable that the oxide semiconductor film is the one which is highly purified and hardly contains impurities such as copper, aluminum, and chlorine. In the manufacturing process of the transistor, steps in which these impurities are not mixed or attached to a surface of the oxide semiconductor film are preferably selected as appropriate. In the case where the impurities are attached to the surface of the oxide semiconductor film, the impurities on the surface of the oxide semiconductor film are preferably removed by exposure to oxalic acid or dilute hydrofluoric acid or plasma treatment (such as $N_2O$ plasma treatment). Specifically, the copper concentration of the oxide semiconductor film is lower than or equal to $1\times10^{18}$ atoms/cm$^3$, preferably lower than or equal to $1\times10^{17}$ atoms/cm$^3$. In addition, the aluminum concentration of the oxide semiconductor film is lower than or equal to $1\times10^{18}$ atoms/cm$^3$. Further, the chlorine concentration of the oxide semiconductor film is lower than or equal to $2\times10^{18}$ atoms/cm$^3$. Accordingly, a transistor having favorable electrical characteristics can be manufactured.

Further, just after being formed, the oxide semiconductor film is preferably in a supersaturated state in which oxygen is contained in a proportion higher than that in the stoichiometric composition. For example, in the case where the oxide semiconductor film is formed by a sputtering method, the film formation is preferably performed under the condition where the proportion of oxygen in a deposition gas is high, in particular, in an oxygen atmosphere (oxygen gas: 100%). When the film formation is performed in the state where the proportion of oxygen in the deposition gas is high, in particular, in an atmosphere containing an oxygen gas at 100%, release of Zn from the film can be suppressed even at a deposition temperature higher than or equal to 300° C.

The oxide semiconductor film is preferably highly purified by sufficient removal of impurities such as hydrogen or by supersaturation with oxygen through sufficient supply of oxygen. Specifically, the hydrogen concentration of the oxide semiconductor film is lower than $5\times10^{18}$ atoms/cm$^3$, preferably lower than or equal to $1\times10^{18}$ atoms/cm$^3$, further preferably lower than or equal to $5\times10^{17}$ atoms/cm$^3$. The concentration of hydrogen in the oxide semiconductor film (the oxide semiconductor film 103, the oxide semiconductor film 109 described later, or an oxide semiconductor film 305 described later) in the manufacturing process of the transistor is measured by secondary ion mass spectrometry (SIMS).

Figure 3B:
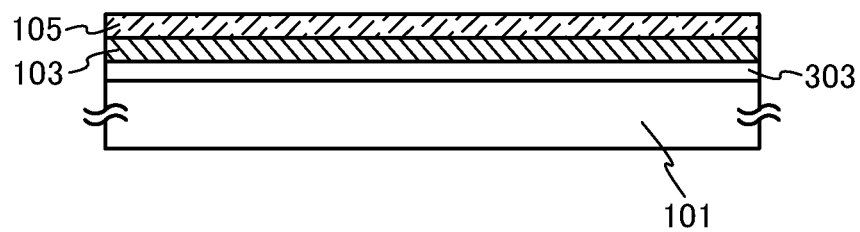

Next, the sacrifice film 105 is formed over the oxide semiconductor film 103 (see FIG. 3B). The sacrifice film 105 is formed to such a thickness that, at the time of injecting oxygen ions later, the local maximum of the concentration distribution in the depth direction of the oxide semiconductor film 103 is located in a region from an interface between the base insulating film 303 and the oxide semiconductor film 103 to an interface between the oxide semiconductor film 103 and the sacrifice film 105 (a surface of the oxide semiconductor film 109 described later). The thickness and formation method of the sacrifice film 105 may be similar to those in Embodiment 1. In this embodiment, the sacrifice film 105 is formed using the same material as the oxide semiconductor film 103. Therefore, the oxide semiconductor film 103 corresponds to the first region described in Embodiment 1, and the sacrifice film 105 corresponds to the second region described in Embodiment 1. Note that the sacrifice film 105 is formed to a thickness of 20 nm in this embodiment; that is, a 40-nm-thick oxide semiconductor film is formed in this embodiment.

Figure 3C:
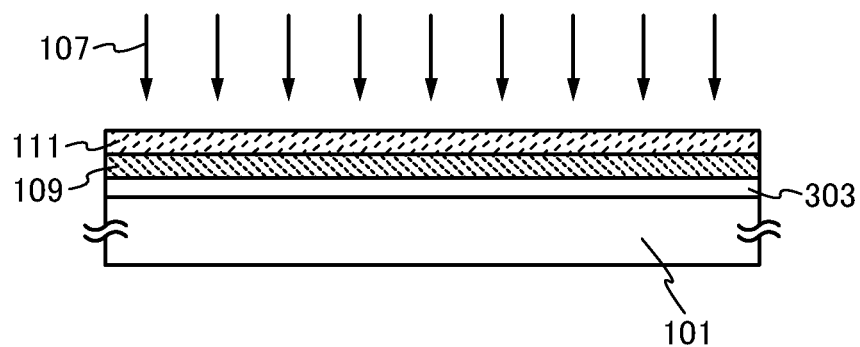

Next, the oxygen ions 107 are injected into the oxide semiconductor film 103 through the sacrifice film 105, so that the oxide semiconductor film 109 and the sacrifice film 111 into which the oxygen ions 107 are injected are formed (see FIG. 3C). The oxygen ions 107 may be injected as in Embodiment 1. That is, the oxygen ions 107 may be injected at a high acceleration voltage. Specifically, the oxygen ions 107 are injected at an acceleration voltage of 20 kV.

Figure 3D:
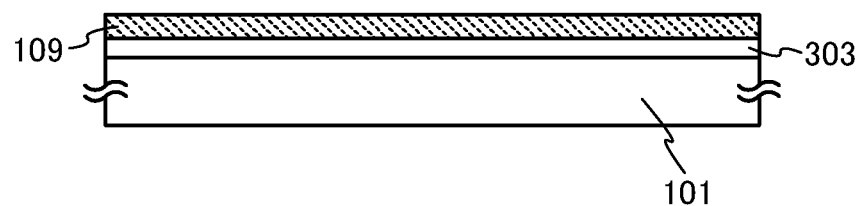

Next, the sacrifice film 111 is removed, so that the surface of the oxide semiconductor film 109 is exposed (see FIG. 3D). The sacrifice film 111 may be removed as in Embodiment 1. In this embodiment, the sacrifice film 111 is removed by wet etching. Note that, since the same material is used for the oxide semiconductor film 109 and the sacrifice film 111, the etching rates thereof are equal to each other. Thus, the etching rate of the oxide semiconductor film 109 and the sacrifice film 111 is calculated in advance, and the sacrifice film 111 is removed under the control of the etching time, which is determined in consideration of the etching rate and the thickness of the sacrifice film 111.

In the oxide semiconductor film 109 obtained through the above steps, oxygen ions are injected so that the amount of change in the concentration distribution in the depth direction is small; therefore, oxygen vacancies are sufficiently filled throughout the region from an interface between the base insulating film 303 and the oxide semiconductor film 109 to the surface of the oxide semiconductor film 109. Accordingly, electrons caused by oxygen vacancies are reduced in a transistor manufactured using the oxide semiconductor film 109, and thus, the transistor has favorable electrical characteristics.

Further, since the oxygen ions 107 are injected throughout the region from the interface between the base insulating film 303 and the oxide semiconductor film 109 to the surface of the oxide semiconductor film 109, the interface state density between the base insulating film 303 and the oxide semiconductor film 109 can be reduced. Accordingly, in a transistor manufactured using the oxide semiconductor film 109, carrier trapping at the interface between the base insulating film 303 and the oxide semiconductor film 109, which can occur in the operation of the transistor or the like, is suppressed; thus, the transistor has excellent reliability.

Furthermore, after the sacrifice film 105 is formed over the oxide semiconductor film 103, the oxygen ions 107 are injected and the sacrifice film 111 is removed, whereby impurities attached to a surface of the oxide semiconductor film 103 can be prevented from being put into the oxide semiconductor film 103 by a knock-on effect. As a result, impurities included in the oxide semiconductor film 109 can be reduced. Accordingly, electrical characteristics of a transistor manufactured using the oxide semiconductor film 109 are prevented from deteriorating owing to such impurities, and thus, the transistor has favorable electrical characteristics.

Moreover, as described in Embodiment 1, by forming the sacrifice film 105 using the same material as the oxide semiconductor film 103 in the formation process of the oxide semiconductor film 109, impurities remaining on the surface of the oxide semiconductor film 109 can be reduced. Accordingly, electrical characteristics of a transistor manufactured using the oxide semiconductor film 109 are prevented from deteriorating owing to such impurities, and thus, the transistor has favorable electrical characteristics.

Heat treatment may be performed after the oxide semiconductor film 109 is formed. By the heat treatment, the degree of crystallinity of the oxide semiconductor film 109 is increased. In addition, the concentration of impurities (such as hydrogen and moisture) in the oxide semiconductor film 109 can be reduced, so that defect density can be reduced.

The heat treatment may be performed in at least one atmosphere of an oxidation atmosphere, an inert atmosphere, a reduced-pressure atmosphere, and a dry-air atmosphere. Preferably, heat treatment is performed in an inert atmosphere or a reduced-pressure atmosphere and then heat treatment is further performed in an oxidation atmosphere or a dry-air atmosphere. The heat treatment may be performed at a temperature higher than or equal to 150° C. and lower than or equal to 650° C., preferably higher than or equal to 250° C. and lower than or equal to 500° C., further preferably higher than or equal to 300° C. and lower than or equal to 450° C. A resistance heating method, a lamp heating method, a method using a heated gas, or the like may be used in the heat treatment.

An oxidation atmosphere refers to an atmosphere containing an oxidation gas. An oxidation gas is oxygen, ozone, nitrous oxide, or the like, and it is preferable that the oxidation gas does not contain water, hydrogen, and the like. For example, the purity of oxygen, ozone, or nitrous oxide introduced into a heat treatment apparatus is higher than or equal to 8N (99.999999%), preferably higher than or equal to 9N (99.9999999%). The oxidation atmosphere may be a mixture of an oxidation gas and an inert gas. In this case, the atmosphere contains an oxidation gas at a concentration at least higher than or equal to 10 ppm. By performing heat treatment in an oxidation atmosphere, the density of oxygen vacancies in the oxide semiconductor film 109 can be reduced.

An inert atmosphere refers to an atmosphere containing an inert gas such as nitrogen or a rare gas as a main component. Specifically, in an inert atmosphere, the concentration of a reactive gas such as an oxidation gas is lower than 10 ppm. By performing heat treatment in an inert atmosphere, the concentration of impurities included in the oxide semiconductor film 109 can be reduced.

A reduced-pressure atmosphere refers to an atmosphere with a pressure of a treatment chamber of lower than or equal to 10 Pa. By performing heat treatment in a reduced-pressure atmosphere, the concentration of impurities included in the oxide semiconductor film 109 can become low as compared with the case of employing an inert atmosphere.

A dry-air atmosphere refers to an atmosphere with a dew point lower than or equal to −40° C., preferably lower than or equal to −50° C. and with an oxygen content of approximately 20% and a nitrogen content of approximately 80%. The dry-air atmosphere is a kind of oxidation atmosphere. Since the dry-air atmosphere is relatively low in cost, it is suitable for mass production.

Figure 4A:
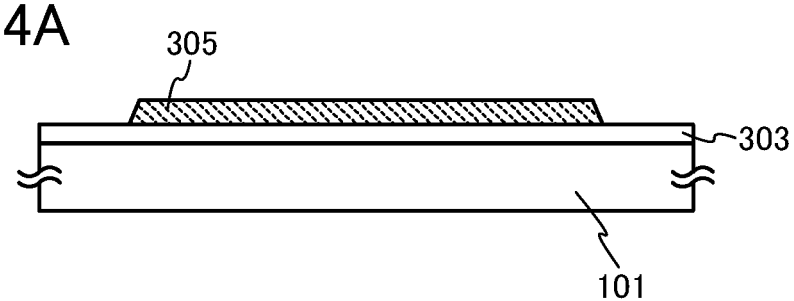
FIGS. 4A to 4D are cross-sectional views illustrating a method for manufacturing a transistor.

Then, the oxide semiconductor film 109 is processed, so that the island-shaped oxide semiconductor film 305 is formed (see FIG. 4A). Note that, unless otherwise specified, "processing" means formation of a film having a desired shape by performing etching treatment with the use of a resist mask formed by a photolithography method and then removing the resist mask.

The above heat treatment that can be performed on the oxide semiconductor film 109 may be performed after the island-shaped oxide semiconductor film 305 is formed.

Next, a gate insulating film 307 is formed over the island-shaped oxide semiconductor film 305. The gate insulating film 307 may be formed to have a single-layer structure or a stacked-layer structure using a material that can be used for the base insulating film 303. In addition, the gate insulating film 307 may be formed by a method similar to that for the base insulating film 303.

The thickness of the gate insulating film 307 is preferably greater than or equal to 5 nm and less than or equal to 200 nm, further preferably greater than or equal to 5 nm and less than or equal to 50 nm. Here, a 20-nm-thick silicon oxynitride film is formed as the gate insulating film 307.

Note that, after the gate insulating film 307 is formed, heat treatment similar to the heat treatment that can be performed after the formation of the oxide semiconductor film 109 may be performed. The heat treatment here can also increase the degree of crystallinity of the oxide semiconductor film 305, and can lower the concentration of impurities (such as hydrogen and moisture) in the oxide semiconductor film 305 to reduce defect density.

Figure 4B:
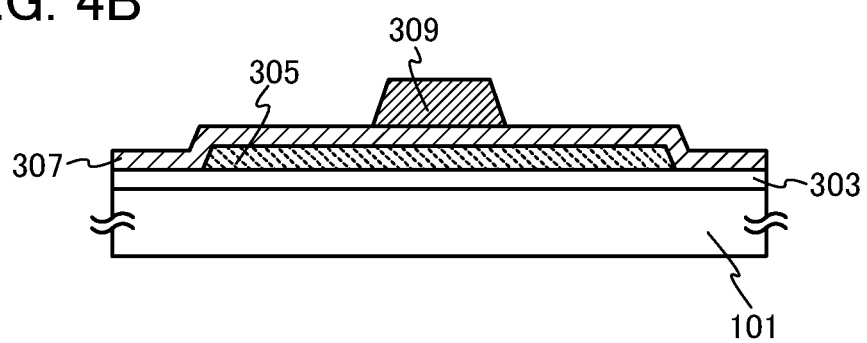
Figure 4C:
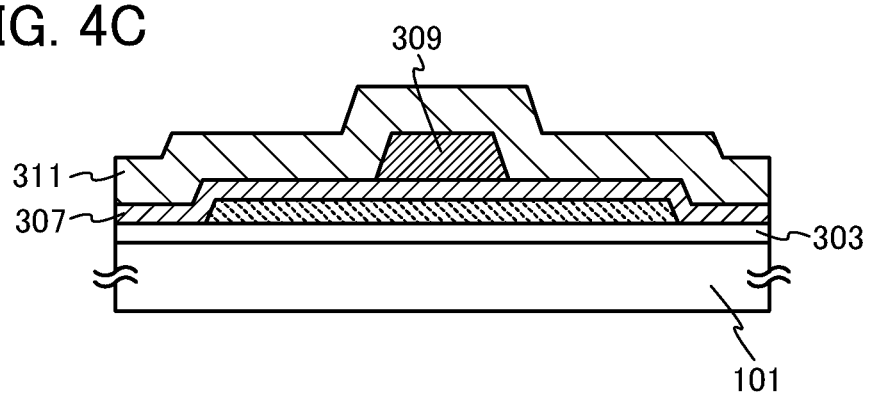

Next, a conductive film is formed over the gate insulating film 307 and processed, so that a gate electrode 309 is formed (see FIG. 4B). As the conductive film, a metal film containing a metal element selected from aluminum, chromium, copper, tantalum, titanium, molybdenum, tungsten, manganese, and zirconium; an alloy film containing any of these metal elements as a component; an alloy film containing any of these metal elements in combination; or the like can be used. Alternatively, an alloy film containing aluminum and one or more metal elements selected from titanium, tantalum, tungsten, molybdenum, chromium, neodymium, and scandium; or a nitride film of the alloy film may be used. Further, the conductive film used to form the gate electrode 309 may have a single-layer structure or a stacked-layer structure of two or more layers. For example, a single-layer structure of an aluminum film containing silicon, a two-layer structure in which a copper film is stacked over a copper-magnesium-aluminum alloy film, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, and a three-layer structure in which a titanium film, an aluminum film, and a titanium film are stacked in this order are given.

The conductive film used to form the gate electrode 309 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductive film can also be formed to have a stacked-layer structure including a film of the above light-transmitting conductive material and the above metal film.

There is no particular limitation on the thickness of the conductive film used to form the gate electrode 309, and the thickness may be determined as appropriate in consideration of the time taken for the formation or the like. Note that the conductive film can be formed by any one of a CVD method, a sputtering method, an MBE method, a PLD method, and a vacuum evaporation method. In addition, the gate electrode 309 also functions as a gate wiring.

Next, an interlayer insulating film 311 is formed over the gate insulating film 307 and the gate electrode 309. The interlayer insulating film 311 may be formed to have a single-layer structure or a stacked-layer structure using a material that can be used for the base insulating film 303. In addition, the interlayer insulating film 311 may be formed by a method similar to that for the base insulating film 303.

Figure 4D:
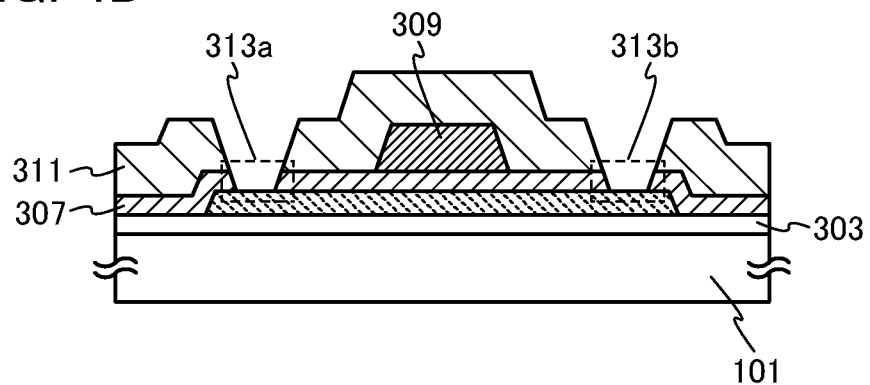

Next, the interlayer insulating film 311 and the gate insulating film 307 are processed so that the oxide semiconductor film 305 is partly exposed; thus, an opening 313a and an opening 313b are formed (see FIG. 4D).

Figure 5A:
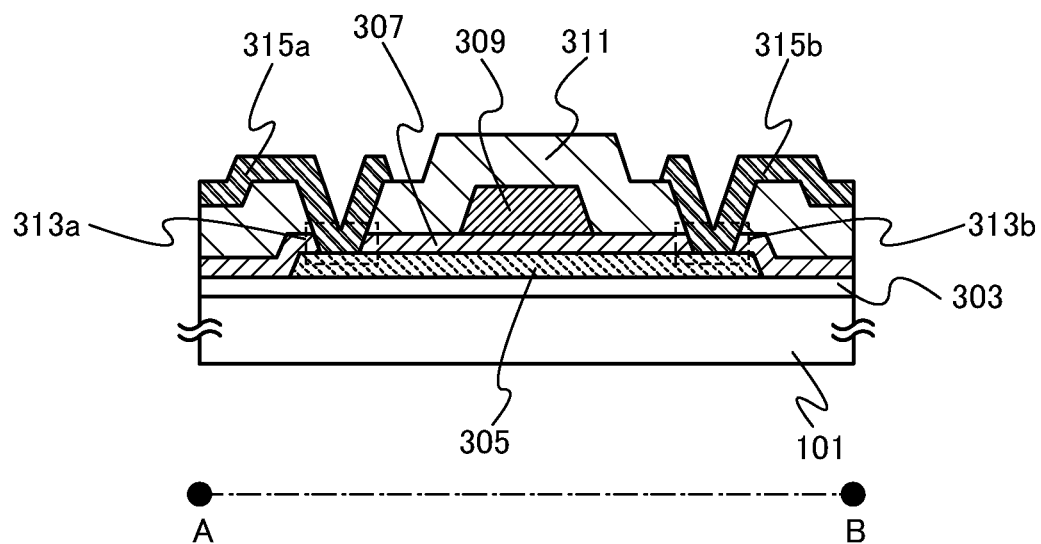
FIGS. 5A and 5B are a cross-sectional view and a top view illustrating a method for manufacturing a transistor.

A conductive film is formed in contact with the partly exposed oxide semiconductor film 305 in the opening 313a and the opening 313b, and the conductive film is processed, so that a source electrode 315a and a drain electrode 315b are formed (see FIG. 5A). The conductive film may be formed using a material that can be used for the conductive film used to form the gate electrode 309 by a method similar to that for the conductive film used to form the gate electrode 309. Note that there is no particular limitation on the thickness of the conductive film to be processed into the source electrode 315a and the drain electrode 315b, and the thickness may be determined as appropriate in consideration of the time taken for the formation or the like. In addition, the source electrode 315a and the drain electrode 315b also function as a source wiring and a drain wiring, respectively.

Note that, although not illustrated, an insulating film including a resin may be formed over the interlayer insulating film 311.

Figure 5B:
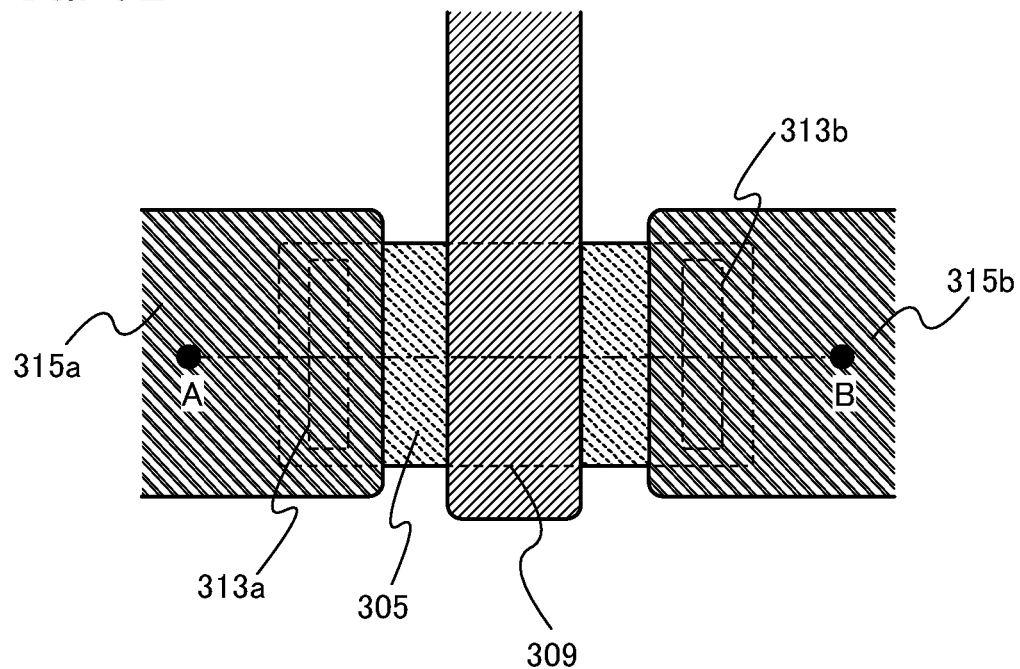

FIG. 5B is a schematic top view of the transistor manufactured by the method for manufacturing a transistor described in this embodiment. FIGS. 3A to 3D, FIGS. 4A to 4D, and FIG. 5A each illustrate a cross section taken along dashed-dotted line A-B in FIG. 5B.

Meanwhile, the base insulating film 303 and/or the gate insulating film 307 may be formed using an oxide insulating film from which part of oxygen is released by heat treatment. The oxide insulating film from which part of oxygen is released by heat treatment can be formed by a sputtering method. In the case where the oxide insulating film (specifically a silicon oxide film) is formed by a sputtering method, a silicon target or a quartz target is used as a target, and oxygen or a mixed gas of oxygen and argon is used as a sputtering gas.

To release oxygen by heat treatment means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$, in a thermal desorption spectroscopy (TDS) analysis.

Here, a method in which the amount of released oxygen is measured by being converted into oxygen atoms using TDS analysis is described below.

The amount of released gas in TDS analysis is proportional to the integral value of a spectrum. Therefore, the amount of released gas can be calculated from the ratio between the integral value of a measured spectrum and a reference value of a standard sample. The reference value of a standard sample refers to the ratio of the density of a predetermined atom contained in a sample to the integral value of a spectrum.

For example, the number of oxygen molecules ($N_{O2}$) released from an insulating film can be found according to Formula 1 with the TDS analysis results of a silicon wafer containing hydrogen at a predetermined density, which is the standard sample, and the TDS analysis results of the insulating film. Here, all spectra having a mass number of 32 which are obtained by the TDS analysis are assumed to originate from an oxygen molecule. CH$_3$OH, which is a gas having a mass number of 32, is not taken into consideration on the assumption that it is unlikely to be present. Further, an oxygen molecule including an oxygen atom having a mass number of 17 or 18, which is an isotope of an oxygen atom, is not taken into consideration either because the proportion of such a molecule in the natural world is minimal.

$$N_{O2} = \frac{N_{H2}}{S_{H2}} \times S_{O2} \times \alpha \qquad \text{[Formula 1]}$$

$N_{H2}$ is the value obtained by conversion of the number of hydrogen molecules desorbed from the standard sample into density. $S_{H2}$ is the integral value of a spectrum of the standard sample which is analyzed by TDS. Here, the reference value of the standard sample is set to $N_{H2}/S_{H2}$. $S_{O2}$ is the integral value of a spectrum of the insulating film which is analyzed by TDS. $\alpha$ is a coefficient which influences the intensity of the spectrum in the TDS analysis. Japanese Published Patent Application No. H6-275697 can be referred to for details of Formula 1. Note that the above value of the amount of released oxygen is obtained by measurement with a thermal desorption spectroscopy apparatus produced by ESCO Ltd., EMD-WA1000S/W using a silicon wafer containing hydrogen atoms at $1 \times 10^{16}$ cm$^{-3}$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of released oxygen atoms can also be estimated through the evaluation of the number of released oxygen molecules.

Note that $N_{O2}$ is the number of the released oxygen molecules. The amount of released oxygen which is converted into oxygen atoms is twice the number of the released oxygen molecules.

As the oxide insulating film from which part of oxygen is released by heat treatment, an oxide insulating film which contains oxygen in a proportion higher than that in the stoichiometric composition can be used. Typical examples include a silicon oxide film, a silicon oxynitride film, an aluminum oxide film, an aluminum oxynitride film, a gallium oxide film, a hafnium oxide film, and an yttrium oxide film, each of which contains oxygen in a proportion higher than that in the stoichiometric composition. In this manner, the oxide insulating film from which part of oxygen is released by heat treatment is used as the base insulating film 303 and/or the gate insulating film 307 and the above heat treatment is performed, whereby oxygen can be diffused into the region from the interface between the base insulating film 303 and the oxide semiconductor film 109 to the surface of the oxide semiconductor film 109; thus, oxygen vacancies in the oxide semiconductor film 109 can be further filled. In order to obtain such an oxygen-supersaturated state through supply of sufficient oxygen, insulating films (such as SiO, films) containing excess oxygen are preferably provided in contact with the oxide semiconductor film (the oxide semiconductor film 103, the oxide semiconductor film 109, or the oxide semiconductor film 305) so that the oxide semiconductor film is positioned therebetween. Note that the thicker the oxide insulating film from which part of oxygen is released by heat treatment is, the more oxygen that can be released is contained therein; therefore, in the case where much oxygen needs to be diffused into the region, the oxide insulating film is preferably formed to be thick.

In addition, the hydrogen concentration of the insulating film containing excess oxygen is also important because it has an effect upon electrical characteristics of the transistor. The reason for this is described later in an example.

In addition, blocking films (such as aluminum oxide films) for suppressing release of oxygen from the oxide semiconductor film are preferably provided so as to be positioned outside the insulating films containing excess oxygen with the oxide semiconductor film positioned between the blocking films.

The oxide semiconductor film is positioned between the insulating films containing excess oxygen or the blocking films, so that the oxide semiconductor film can be in a state in which oxygen is contained in a proportion approximately the same as that in the stoichiometric composition or a supersaturated state in which oxygen is contained in a proportion higher than that in the stoichiometric composition. For example, in the case where the oxide semiconductor film is formed of IGZO and the stoichiometric composition is In:Ga:Zn:O=1:1:1:4 [atomic ratio], the ratio of oxygen atoms is larger than 4.

Figure 6A:
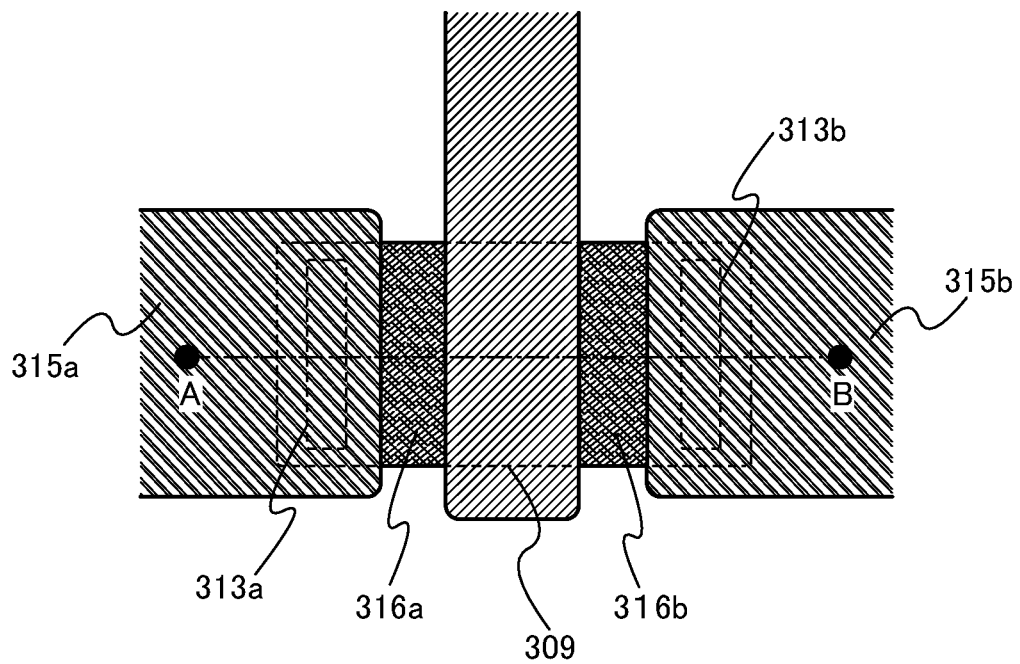
FIGS. 6A and 6B are a top view and a cross-sectional view illustrating an example of a transistor.
Figure 6B:
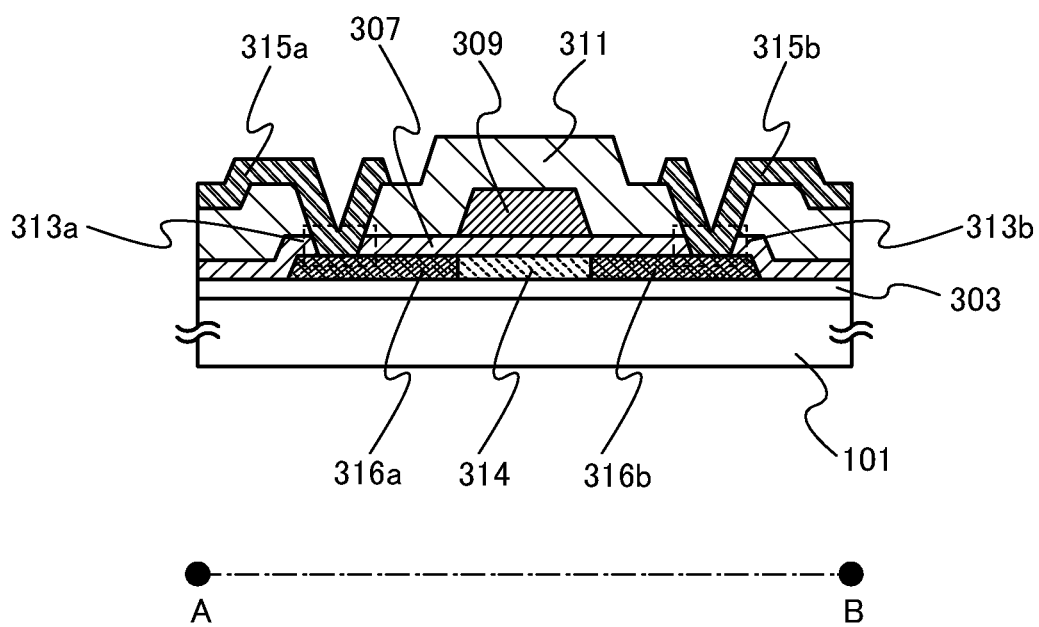

Note that a dopant may be injected into the oxide semiconductor film 305 with the use of the gate electrode 309 as a mask to form a low-resistance region 316a and a low-resistance region 316b. In the oxide semiconductor film 305, a region into which the dopant that reduces the resistance of the oxide semiconductor film 305 is not injected is a high-resistance region 314. FIG. 6A is a schematic top view of a transistor including the low-resistance region 316a, the low-resistance region 316b, and the high-resistance region 314. FIG. 6B is a schematic cross-sectional view of the transistor, which illustrates a cross section taken along dashed-dotted line A-B in FIG. 6A. The transistor has the same structure as the transistor illustrated in FIGS. 5A and 5B except for the low-resistance regions 316a and 316b and the high-resistance region 314.

As the dopant that reduces the resistance of the oxide semiconductor film 305, one or more of helium, boron, nitrogen, fluorine, neon, aluminum, phosphorus, argon, arsenic, krypton, indium, tin, antimony, and xenon may be used. Note that the dopant may be injected by an ion implantation method or an ion doping method. The dopant that reduces the resistance of the oxide semiconductor film 305 may be injected into the oxide semiconductor film 305 by performing plasma treatment or heat treatment in an atmosphere containing the dopant. It is preferable to employ an ion implantation method. After the dopant that reduces the resistance of the oxide semiconductor film 305 is added by an ion implantation method, heat treatment may be performed in an inert atmosphere or a reduced-pressure atmosphere.

By forming the low-resistance regions in the oxide semiconductor film 305 in the above manner, the contact resistance between the source and drain electrodes 315a and 315b and the oxide semiconductor film 305 can be reduced, which leads to improvement in on-state characteristics of the transistor manufactured.

According to the method for manufacturing a transistor described in this embodiment, oxygen vacancies in an oxide semiconductor film serving as a channel formation region can be sufficiently filled and electrons caused by such oxygen vacancies are reduced; consequently, a transistor having favorable electrical characteristics can be manufactured. Further, in the method for manufacturing a transistor described in this embodiment, an oxide insulating film from which part of oxygen is released by heat treatment is used as a base insulating film and/or a gate insulating film and heat treatment is performed, whereby oxygen vacancies in the oxide semiconductor film serving as the channel formation region can be filled. Thus, this method can achieve shorter-time filling of oxygen vacancies than in the case where the oxide insulating film is not used, and the transistor having favorable electrical characteristics can be manufactured with higher productivity.

Note that the structures, methods, and the like described in this embodiment can be used as appropriate in combination with any of the structures, methods, and the like described in the other embodiments and examples.

Embodiment 4

In this embodiment, a method for manufacturing a semiconductor device with the use of the method for forming an insulating film described in Embodiment 2 is described. Note that a transistor using an oxide semiconductor is described as an example of the semiconductor device also in this embodiment. In addition, the method for forming an insulating film described in Embodiment 2 can be applied to the manufacture of transistors having a variety of structures, such as a top-gate transistor, a bottom-gate transistor, and a dual-gate transistor; a top-gate transistor is described here as an example. In this embodiment, FIGS. 7A to 7D, FIGS. 8A to 8C, FIGS. 9A and 9B, and FIGS. 10A and 10B are used.

First, the substrate 101 is prepared. The substrate 101 may be similar to that in Embodiment 3.

Figure 7A:
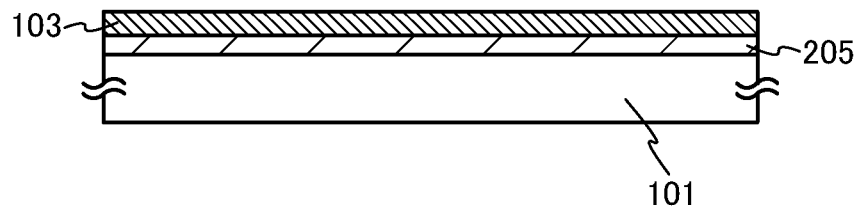
FIGS. 7A to 7D are cross-sectional views illustrating a method for manufacturing a transistor.

Next, the insulating film 205 is formed as a base insulating film over the substrate 101, and the oxide semiconductor film 103 is formed over the insulating film 205 (see FIG. 7A).

The insulating film 205 serving as the base insulating film can be formed by the method described in Embodiment 2 (see FIGS. 2A to 2E). Thus, in the insulating film 205, the local maximum of the concentration distribution of injected oxygen ions is located in a region from an interface between the substrate 101 and the insulating film 205 to a surface of the insulating film 205, particularly in the vicinity of the surface of the insulating film 205. Further, oxygen ions are injected into the insulating film 205 uniformly in the depth direction of the insulating film 205. Furthermore, as the amount of injected oxygen ions is increased, the amount of oxygen contained in the insulating film 205 formed by the method described in Embodiment 2 can be increased so as to exceed that in the stoichiometric composition; thus, the insulating film 205 functions as the oxide insulating film from which part of oxygen is released by heat treatment, which is described in Embodiment 3. In addition, as the amount of injected oxygen ions is increased, the thickness of the insulating film 205 formed by the method described in Embodiment 2 can be reduced. The insulating film 205 can be formed to a thickness greater than or equal to 5 nm and less than or equal to 500 nm. In this embodiment, the sacrifice film 105 is formed using the same material as the insulating film 203, and the insulating film 205 is formed to a thickness of 20 nm.

After the sacrifice film 105 is formed over the insulating film 203, the oxygen ions 107 are injected and the sacrifice film 111 is removed, whereby impurities attached to a surface of the insulating film 203 can be prevented from being put into the insulating film 203 by a knock-on effect. As a result, impurities included in the insulating film 205 can be reduced. Accordingly, a transistor having favorable electrical characteristics which are prevented from deteriorating owing to such impurities can be manufactured.

As described in Embodiment 2, by forming the sacrifice film 105 using the same material as the insulating film 203 in the formation process of the insulating film 205, impurities remaining on the surface of the insulating film 205 can be reduced. Accordingly, a transistor having favorable electrical characteristics which are prevented from deteriorating owing to such impurities can be manufactured.

The oxide semiconductor film 103 can be formed as in Embodiment 3. In this manner, the oxide semiconductor film 103 is formed over the insulating film 205 which contains oxygen in a proportion higher than that in the stoichiometric composition, whereby oxygen vacancies in the oxide semiconductor film 103 can be filled.

Heat treatment may be performed after the oxide semiconductor film 103 is formed. By the heat treatment, the degree of crystallinity of the oxide semiconductor film 103 is increased. In addition, the concentration of impurities (such as hydrogen and moisture) in the oxide semiconductor film 103 can be reduced, so that defect density can be reduced. Details of the heat treatment may be similar to those in Embodiment 3.

Figure 7B:
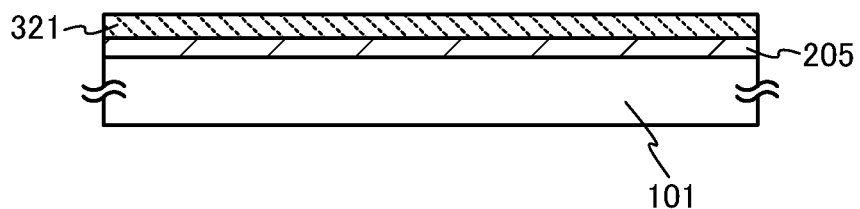
Figure 7C:
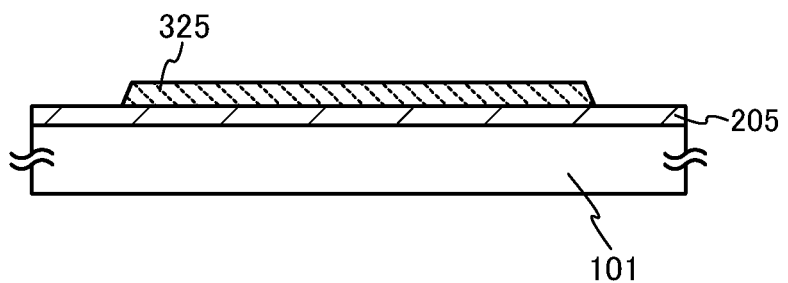
Figure 7D:
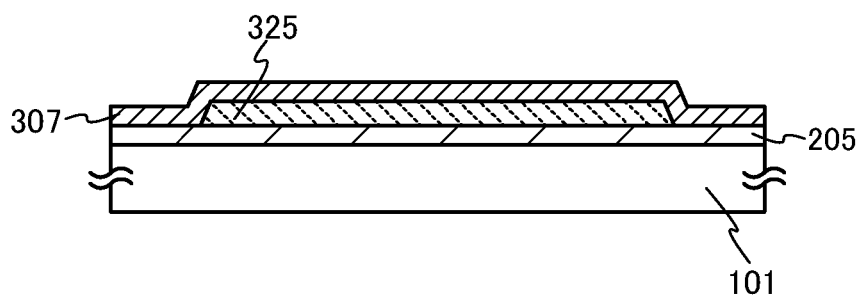
Figure 8A:
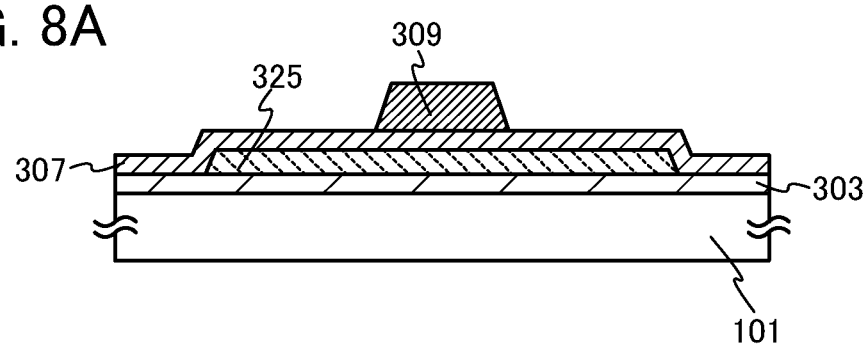
FIGS. 8A to 8C are cross-sectional views illustrating a method for manufacturing a transistor.
Figure 8B:
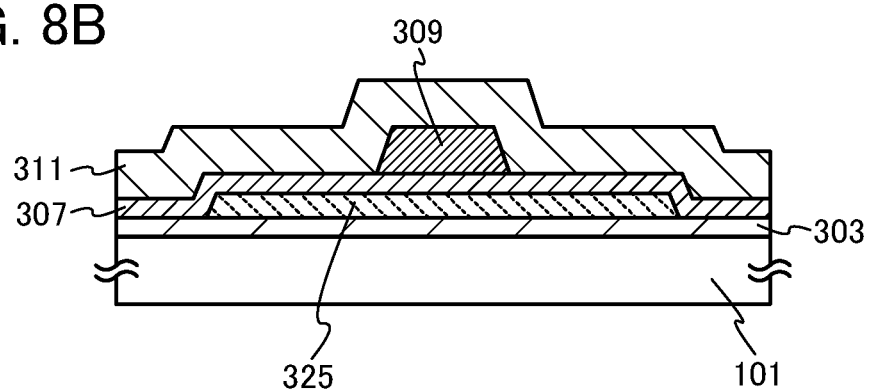
Figure 8C:
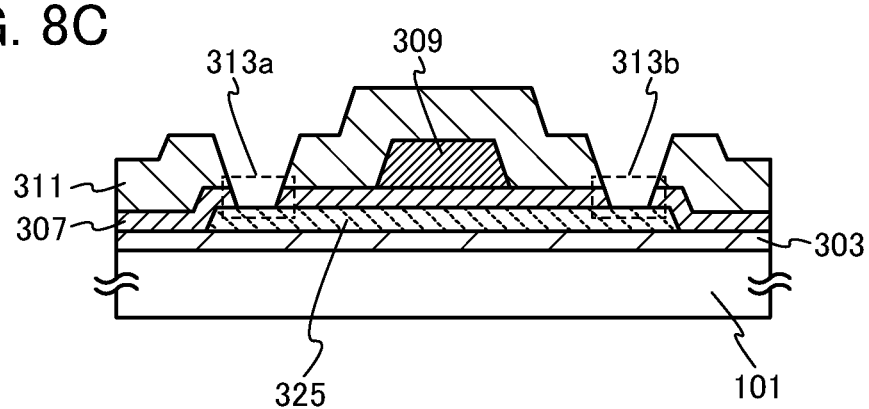

Further, the above heat treatment enables oxygen to be diffused into a region from an interface between the insulating film 205 and the oxide semiconductor film 103 to a surface of the oxide semiconductor film 103 to fill oxygen vacancies in the oxide semiconductor film 103, so that an oxide semiconductor film 321 in which oxygen vacancies are filled can be formed (see FIG. 7B). Electrons caused by oxygen vacancies are reduced in a transistor formed using the oxide semiconductor film 321 in which oxygen vacancies are filled, and thus, the transistor has favorable electrical characteristics.

Further, since the oxygen ions 107 are injected throughout the region from an interface between the insulating film 205 and the oxide semiconductor film 321 to a surface of the oxide semiconductor film 321, the interface state density between the insulating film 205 and the oxide semiconductor film 321 can be reduced. Accordingly, carrier trapping at the interface between the insulating film 205 and the oxide semiconductor film 321, which can occur in the operation of the transistor or the like, is suppressed; thus, a transistor having excellent reliability can be manufactured.

Figure 9A:
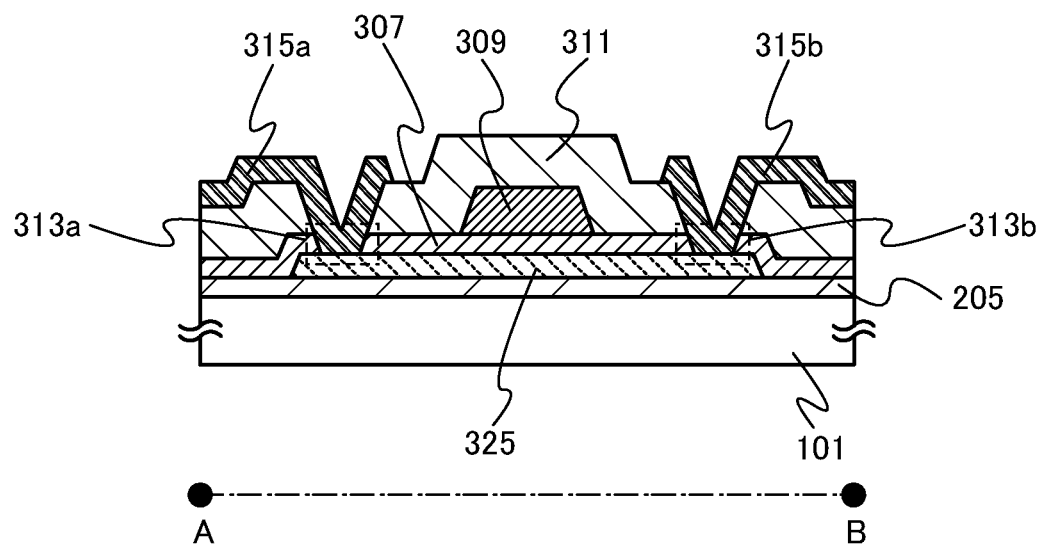
FIGS. 9A and 9B are a cross-sectional view and a top view illustrating a method for manufacturing a transistor.

As the following steps, the oxide semiconductor film 321 is processed to form an oxide semiconductor film 325 (see FIG. 7C), the gate insulating film 307 is formed (see FIG. 7D), the gate electrode 309 is formed (see FIG. 8A), the interlayer insulating film 311 is formed (see FIG. 8B), the interlayer insulating film 311 is processed to form the opening 313a and the opening 313b (see FIG. 8C), and the source electrode 315a and the drain electrode 315b are formed (see FIG. 9A). Details of the steps are similar to those in Embodiment 3.

Note that, although not illustrated, an insulating film including a resin may be formed over the interlayer insulating film 311.

Figure 9B:
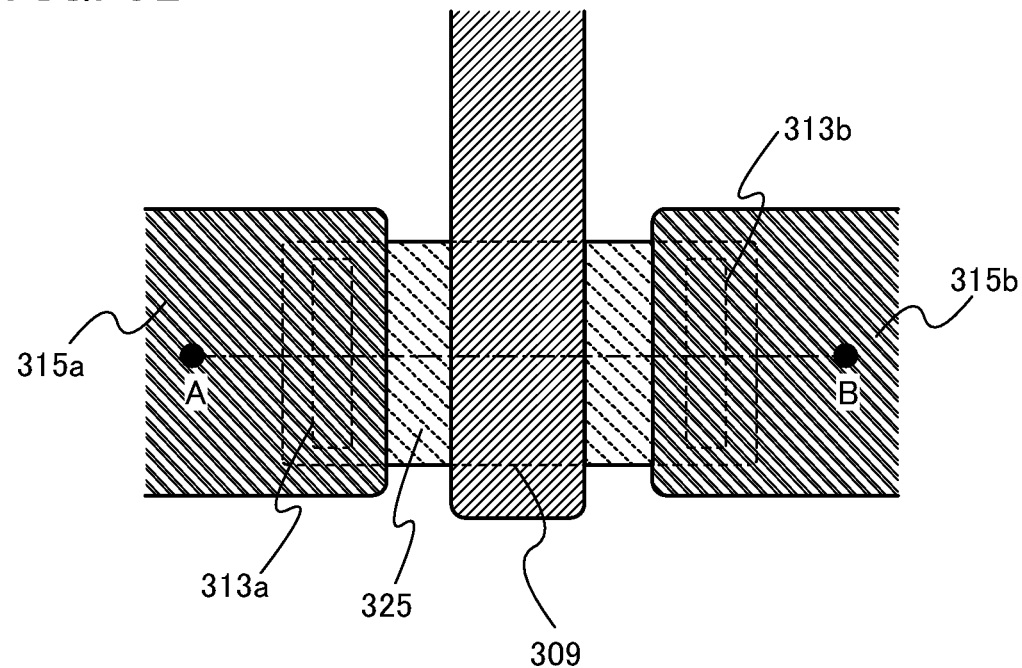

FIG. 9B is a schematic top view of the transistor manufactured by the method for manufacturing a transistor described in this embodiment. FIGS. 7A to 7D, FIGS. 8A to 8C, and FIG. 9A each illustrate a cross section taken along dashed-dotted line A-B in FIG. 9B.

Figure 10A:
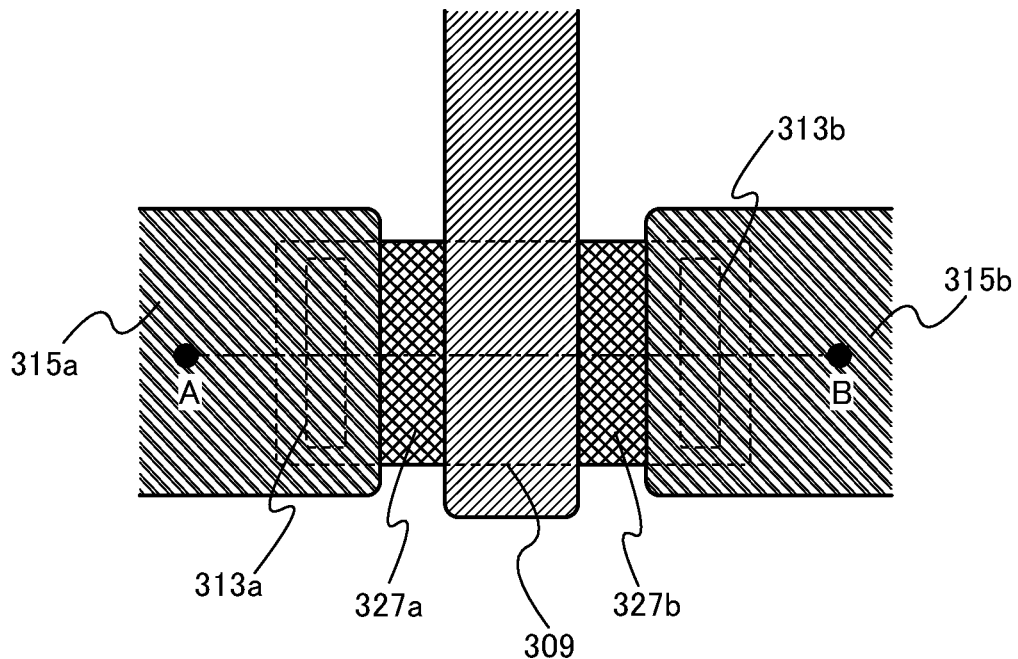
FIGS. 10A and 10B are a top view and a cross-sectional view illustrating an example of a transistor.
Figure 10B:
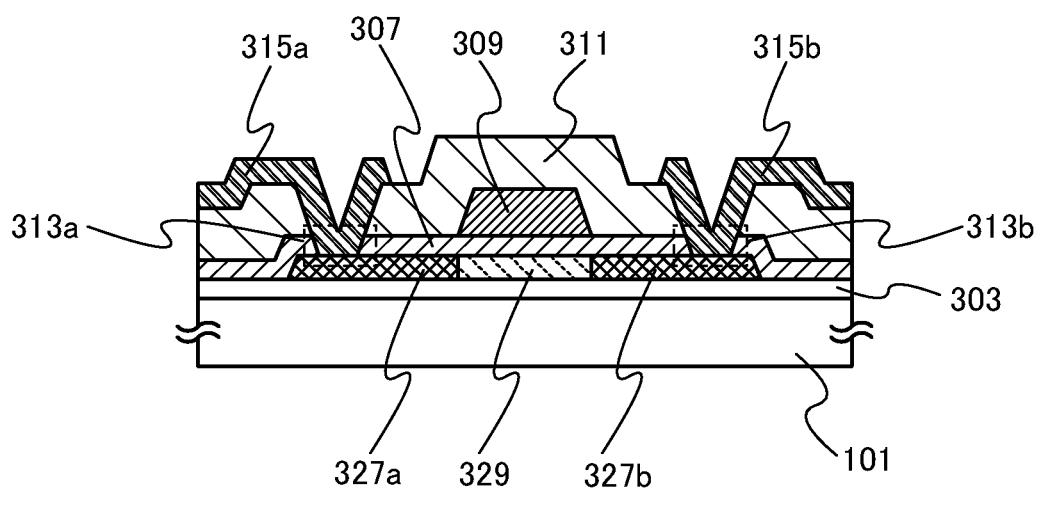

Note that, as in Embodiment 3, a dopant may be injected into the oxide semiconductor film 325 with the use of the gate electrode 309 as a mask to form a low-resistance region 327a and a low-resistance region 327b. In the oxide semiconductor film 325, a region into which the dopant that reduces the resistance of the oxide semiconductor film 325 is not injected is a high-resistance region 329. FIG. 10A is a schematic top view of a transistor including the low-resistance region 327a, the low-resistance region 327b, and the high-resistance region 329. FIG. 10B is a schematic cross-sectional view of the transistor, which illustrates a cross section taken along dashed-dotted line A-B in FIG. 10A. The transistor has the same structure as the transistor illustrated in FIGS. 9A and 9B except for the low-resistance region 327a, the low-resistance region 327b, and the high-resistance region 329.

As the dopant that reduces the resistance of the oxide semiconductor film 325, one or more of helium, boron, nitrogen, fluorine, neon, aluminum, phosphorus, argon, arsenic, krypton, indium, tin, antimony, and xenon may be used. Note that the dopant may be injected by an ion implantation method or an ion doping method. The dopant that reduces the resistance of the oxide semiconductor film 325 may be injected into the oxide semiconductor film 325 by performing plasma treatment or heat treatment in an atmosphere containing the dopant. It is preferable to employ an ion implantation method. After the dopant that reduces the resistance of the oxide semiconductor film 325 is added by an ion implantation method, heat treatment may be performed in an inert atmosphere or a reduced-pressure atmosphere.

By forming the low-resistance regions in the oxide semiconductor film 325 in the above manner, the contact resistance between the source and drain electrodes 315a and 315b and the oxide semiconductor film 325 can be reduced, which leads to improvement in on-state characteristics of the transistor.

According to the method for manufacturing a transistor described in this embodiment, oxygen vacancies in an oxide semiconductor film serving as a channel formation region can be sufficiently filled and electrons caused by such oxygen vacancies are reduced; consequently, a transistor having favorable electrical characteristics can be manufactured. Further, in the method for manufacturing a transistor described in this embodiment, an oxide semiconductor film is formed over a base insulating film into which oxygen ions are injected so that the amount of change in the concentration distribution in the depth direction is small and then heat treatment may be performed, whereby oxygen can be diffused from the base insulating film into the oxide semiconductor film to fill oxygen vacancies. Thus, oxygen ions are not directly injected into the oxide semiconductor film; therefore, oxygen vacancies can be filled without a large degradation in the crystallinity of the oxide semiconductor film. Accordingly, deterioration in electrical characteristics due to a large degradation in crystallinity can be suppressed, and a transistor having favorable electrical characteristics can be manufactured.

Furthermore, according to the method for manufacturing a transistor described in this embodiment, the local maximum of the concentration distribution in the depth direction can be located close to a surface of the base insulating film, and the amount of change in the concentration distribution can be small. Accordingly, when an oxide semiconductor film is formed over the base insulating film, the distance which oxygen ion travels to the oxide semiconductor film can be shortened. Consequently, oxygen vacancies in the oxide semiconductor film can be efficiently filled, and a transistor having favorable electrical characteristics can be manufactured.

Note that the structures, methods, and the like described in this embodiment can be used as appropriate in combination with any of the structures, methods, and the like described in the other embodiments and examples.

Embodiment 5

In this embodiment, the oxide semiconductor film in the above embodiment is described. The oxide semiconductor film in the above embodiment may have an amorphous structure or a crystalline structure, and preferably has a crystalline structure. As the oxide semiconductor film having a crystalline structure, a single crystal oxide semiconductor film, a polycrystalline (also referred to as polycrystal) oxide semiconductor film, or the like can be used; it is preferable to use a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that, in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a decrease in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement is formed when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a simple term "perpendicular" includes a range from 85° to 95°. In addition, a simple term "parallel" includes a range from −5° to 5°.

In the CAAC-OS film, the distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to the normal vector of the surface where the CAAC-OS film is formed or the normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that, when the CAAC-OS film is formed, the direction of the c-axis of the crystal part is the direction parallel to the normal vector of the surface where the CAAC-OS film is formed or the normal vector of the surface of the CAAC-OS film. The crystal part is formed by film formation or by performing treatment for crystallization such as heat treatment after film formation.

In a transistor formed using the CAAC-OS film, a change in electrical characteristics due to irradiation with visible light or ultraviolet light is small. Therefore, the transistor has highly reliable electrical characteristics.

In the case where the oxide semiconductor film in the above embodiment is the CAAC-OS film, the substrate is heated to a temperature higher than 200° C. and lower than or equal to 700° C., preferably higher than 300° C. and lower than or equal to 500° C., further preferably higher than or equal to 400° C. and lower than or equal to 450° C. during the formation of the oxide semiconductor film (the oxide semiconductor film 103 in the above embodiment). The oxide semiconductor film is formed while the substrate is heated in this manner, whereby the CAAC-OS film can be formed.

Further, in the case where the oxide semiconductor film in the above embodiment is the CAAC-OS film, the base insulating film preferably has sufficient planarity. Specifically, the film serving as a base is provided so as to have an average surface roughness (Ra) of 1 nm or less, preferably 0.3 nm or less, further preferably 0.1 nm or less. When the average surface roughness Ra is less than or equal to the above value, a crystal region is easily formed in the oxide semiconductor film. Note that the average surface roughness Ra is obtained by expanding, into three dimensions, arithmetic mean surface roughness that is defined by JIS B 0601:2001 (ISO4287: 1997) so as to be applicable to a curved surface. The average surface roughness Ra can be expressed as an "average value of the absolute values of deviations from a reference surface to a designated surface" and is defined by Formula 2.

$$Ra = \frac{1}{S_0} \int_{y1}^{y2} \int_{x1}^{x2} |f(x, y) - Z_0| \, dx \, dy \qquad \text{[Formula 2]}$$

Here, the designated surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the designated surface on the xy plane, and $Z_0$ represents the height of the reference surface (the average height of the designated surface). The average surface roughness Ra can be measured with an atomic force microscope (AFM).

Note that the structures, methods, and the like described in this embodiment can be used as appropriate in combination with any of the structures, methods, and the like described in the other embodiments and examples.

Embodiment 6

In this embodiment, an example of manufacturing a semiconductor memory device with the use of the transistor described in the above embodiment is described.

As typical examples of a volatile semiconductor memory device, there are a dynamic random access memory (DRAM) which stores data in such a manner that a transistor included in a memory element is selected and charge is accumulated in a capacitor, and a static random access memory (SRAM) which holds stored data using a circuit such as a flip-flop.

Typical examples of a nonvolatile semiconductor memory device include a flash memory which has a node between a gate and a channel region of a transistor and stores data by holding charge in the node.

The transistor described in the above embodiment can be applied to part of transistors included in the above semiconductor memory device.

First, a volatile memory to which the transistor described in the above embodiment is applied is described with reference to FIGS. 11A and 11B.

Figure 11A:
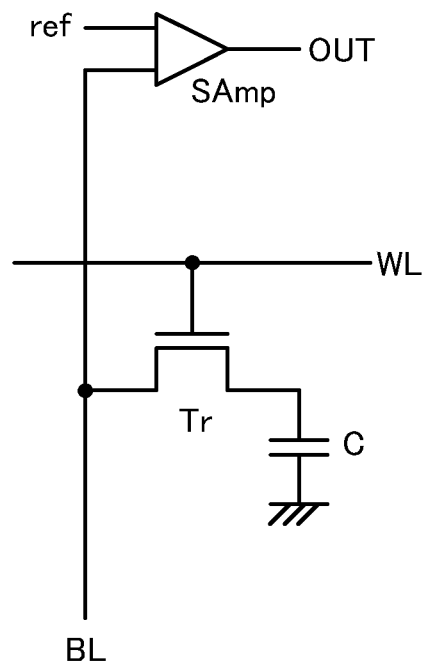
FIG. 11A is a circuit diagram illustrating an example of a semiconductor memory device.

A memory cell includes a bit line BL, a word line WL, a sense amplifier SAmp, a transistor Tr, and a capacitor C (see FIG. 11A).

Figure 11B:
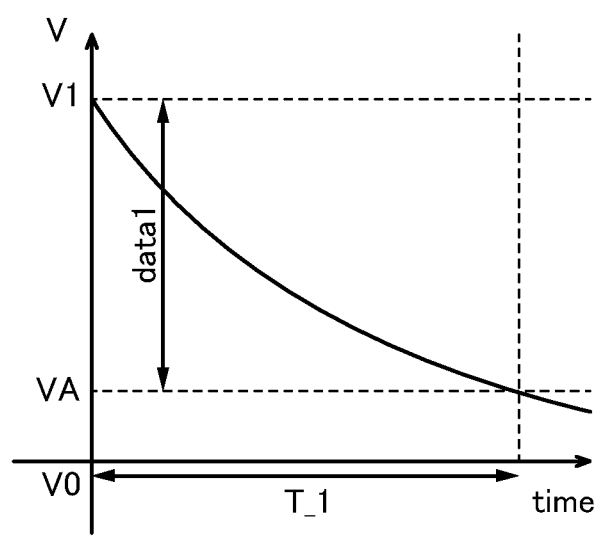
FIG. 11B is a graph showing electrical characteristics thereof.

It is known that the voltage held in the capacitor C is gradually decreased with time as shown in FIG. 11B owing to the off-state current of the transistor Tr. After a certain period of time, the voltage originally raised from V0 to V1 by charging is decreased to VA which is a limit for reading data 1. This period is called a holding period T_1. In the case of a two-level memory cell, refresh operation needs to be performed within the holding period T_1.

When the transistor described in the above embodiment is used as the transistor Tr, the holding period T_1 can be made longer because the off-state current of the transistor is small. That is, the interval between refresh operations can be longer. Accordingly, power consumption can be reduced. For example, a DRAM including a transistor which is formed using an oxide semiconductor film and has an off-state current less than or equal to $1 \times 10^{-21}$ A, preferably less than or equal to $1 \times 10^{-24}$ A, can hold data for several days to several decades without being supplied with power.

As described above, with the use of the transistor of one embodiment of the present invention, a volatile memory with high reliability and low power consumption can be obtained.

Further, the transistor of one embodiment of the present invention has excellent on-state characteristics; thus, by applying the transistor of one embodiment of the present invention, it is possible to provide a semiconductor memory device capable of high-speed operation, in which charge can be quickly accumulated in the capacitor C.

Next, a nonvolatile memory to which the transistor described in the above embodiment is applied is described with reference to FIGS. 12A and 12B.

Figure 12A:
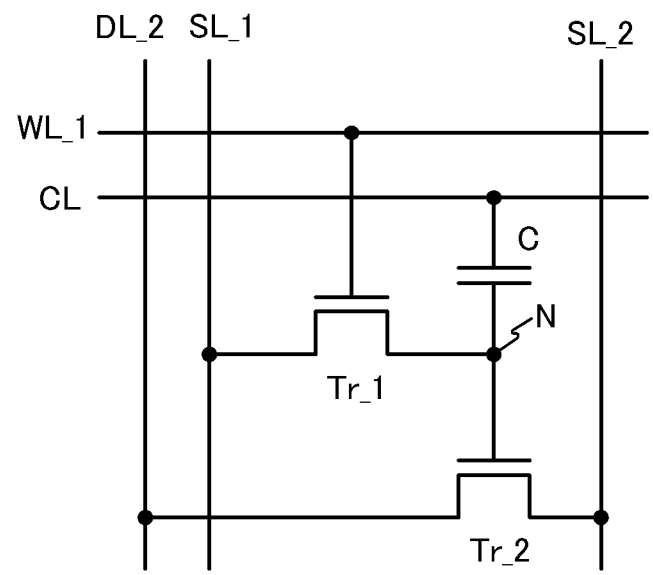
FIG. 12A is a circuit diagram illustrating an example of a semiconductor memory device.
Figure 12B:
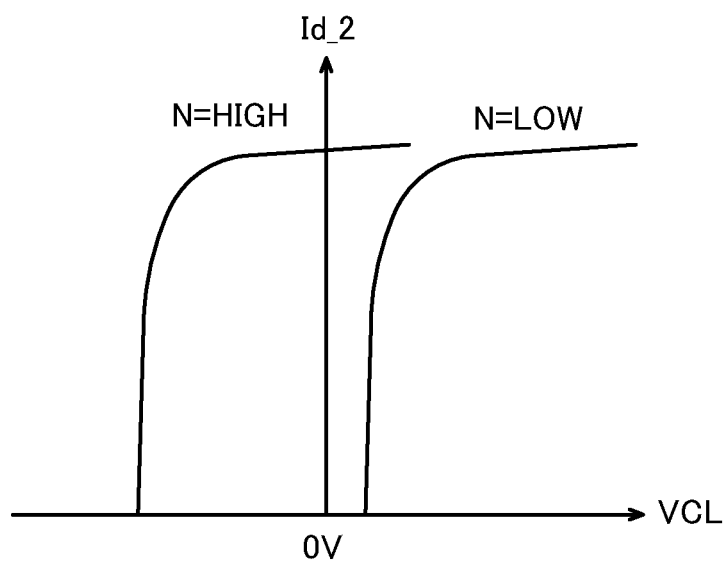
FIG. 12B is a graph showing electrical characteristics thereof.

FIG. 12A is a circuit diagram of a nonvolatile memory. The nonvolatile memory includes a transistor Tr_1, a word line WL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a node N connected to the other terminal of the capacitor C, a drain of the transistor Tr_1, and a gate of the transistor Tr_2.

The nonvolatile memory described in this embodiment utilizes change in the threshold voltage of the transistor Tr_2, which depends on the potential of the node N. For example, FIG. 12B shows a relation between a voltage VCL of the capacitor line CL and a drain current Id_2 flowing through the transistor Tr_2.

The voltage of the node N can be controlled with the transistor Tr_1. For example, the potential of the source line SL_1 is set to VDD. In this case, when the potential of the word line WL_1 is set to be higher than or equal to a potential obtained by adding VDD to the threshold voltage Vth of the transistor Tr_1, the potential of the node N can be HIGH. Further, when the potential of the word line WL_1 is set to be lower than or equal to the threshold voltage Vth of the transistor Tr_1, the potential of the node N can be LOW.

Thus, either a VCL-Id_2 curve (N=LOW) or a VCL-Id_2 curve (N=HIGH) can be obtained. That is, when N=LOW, Id_2 is small at a VCL of 0 V; accordingly, data 0 is stored. Further, when N=HIGH, Id_2 is large at a VCL of 0 V; accordingly, data 1 is stored. In this manner, data can be stored.

Here, when the transistor described in the above embodiment is used as the transistor Tr_1, the off-state current of the transistor can be significantly reduced; therefore, unintentional leakage of charge accumulated in the node N by flowing between the source and the drain of the transistor Tr_1 can be suppressed. Therefore, data can be held for a long period.

By using the transistor of one embodiment of the present invention, the threshold voltage of the transistor Tr_1 is controlled, which enables a reduction in voltage necessary for writing. Thus, power consumption can be made small as compared with that of a flash memory or the like.

Note that the transistor described in the above embodiment may be used as the transistor Tr_2. The transistor has excellent on-state characteristics. Accordingly, a semiconductor memory device including the transistor can operate at high speed.

As described above, by using the transistor of one embodiment of the present invention, a semiconductor memory device having high reliability for a long period and low power consumption and being capable of high-speed operation can be obtained.

Note that the structures, methods, and the like described in this embodiment can be used as appropriate in combination with any of the structures, methods, and the like described in the other embodiments and examples.

Embodiment 7

A central processing unit (CPU) can be formed with the use of the transistor described in the above embodiment or the semiconductor memory device described in the above embodiment for at least part of the CPU.

Figure 13A:
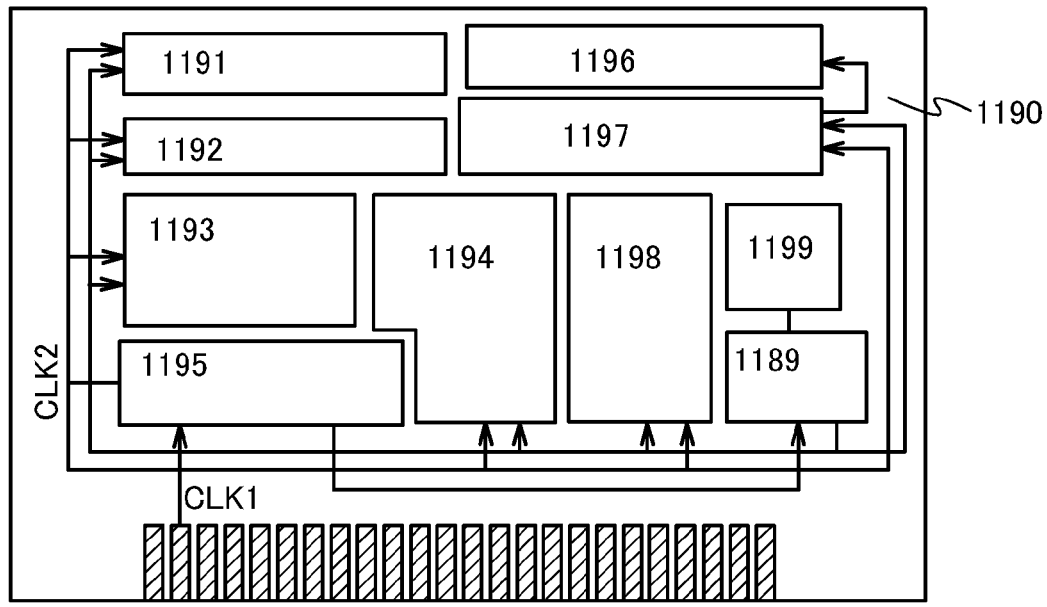
FIG. 13A is a block diagram illustrating a specific example of a CPU.

FIG. 13A is a block diagram illustrating a specific structure of a CPU. The CPU illustrated in FIG. 13A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 13A is just an example in which the structure is simplified, and an actual CPU may have various structures depending on the application.

An instruction that is input to the CPU through the bus interface 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 13A, a memory element is provided in the register 1196. As the memory element in the register 1196, the semiconductor memory device described in Embodiment 6 can be used.

In the CPU illustrated in FIG. 13A, the register controller 1197 selects operation of holding data in the register 1196 in accordance with an instruction from the ALU 1191. That is, the register controller 1197 selects whether data is held by an element which inverts a logic (logic value) or a capacitor in the memory element included in the register 1196. When data is held by the element which inverts a logic (logic value), a power supply voltage is supplied to the memory element in the register 1196. When data is held by the capacitor, the data in the capacitor is rewritten, and supply of the power supply voltage to the memory element in the register 1196 can be stopped.

Figure 13B:
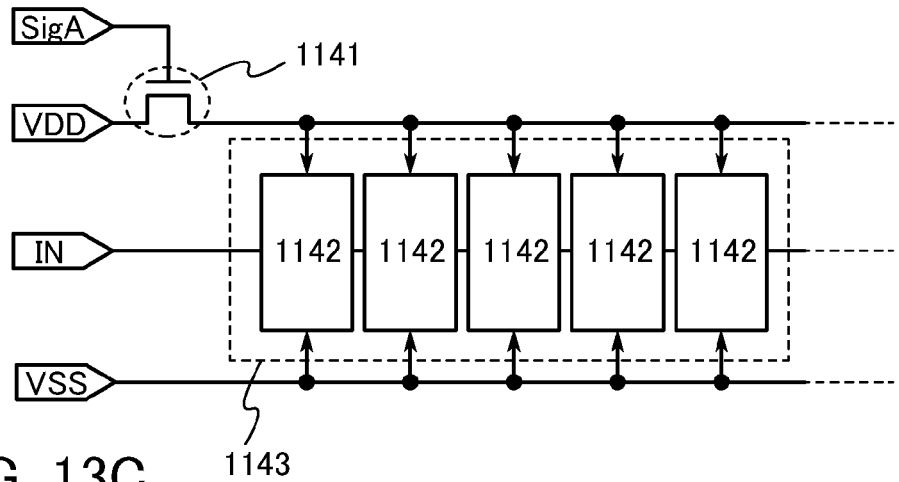
FIGS. 13B and 13C are circuit diagrams each illustrating part of the CPU.
Figure 13C:
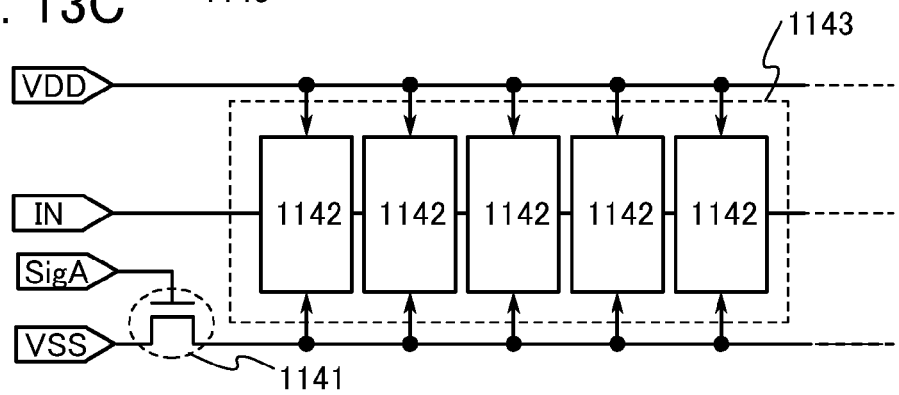

The power supply can be stopped by providing a switching element between a memory element group and a node to which a power supply potential VDD or a power supply potential VSS is supplied, as illustrated in FIG. 13B or FIG. 13C. Circuits illustrated in FIGS. 13B and 13C are described below.

FIGS. 13B and 13C each illustrate an example of a structure including the transistor described in the above embodiment as a switching element for controlling supply of a power supply potential to a memory element.

The memory device illustrated in FIG. 13B includes a switching element 1141 and a memory element group 1143 including a plurality of memory elements 1142. Specifically, as each of the memory elements 1142, the memory element described in the above embodiment can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and the low-level power supply potential VSS.

In FIG. 13B, as the switching element 1141, a transistor in which a semiconductor with a wide band gap such as an oxide semiconductor is used for an active layer is used, and the switching of the transistor is controlled by a signal SigA supplied to a gate thereof.

Note that FIG. 13B illustrates a structure in which the switching element 1141 includes only one transistor; however, one embodiment of the present invention is not limited thereto. The switching element 1141 may include a plurality of transistors. In the case where the switching element 1141 includes a plurality of transistors functioning as switching elements, the plurality of transistors may be connected to each other in parallel, in series, or in combination of parallel connection and series connection.

In FIG. 13C, an example of a memory device in which each of the memory elements 1142 included in the memory element group 1143 is supplied with the low-level power supply potential VSS through the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that power consumption can be reduced.

Although the CPU is given as an example, the transistor or the semiconductor memory device can also be applied to an LSI such as a digital signal processor (DSP), a custom LSI, or a field programmable gate array (FPGA).

Note that the structures, methods, and the like described in this embodiment can be used as appropriate in combination with any of the structures, methods, and the like described in the other embodiments and examples.

Embodiment 8

In this embodiment, examples of an electronic device including at least one of the transistors, the semiconductor memory devices, and the CPU described in the above embodiments are described.

Figure 14A:
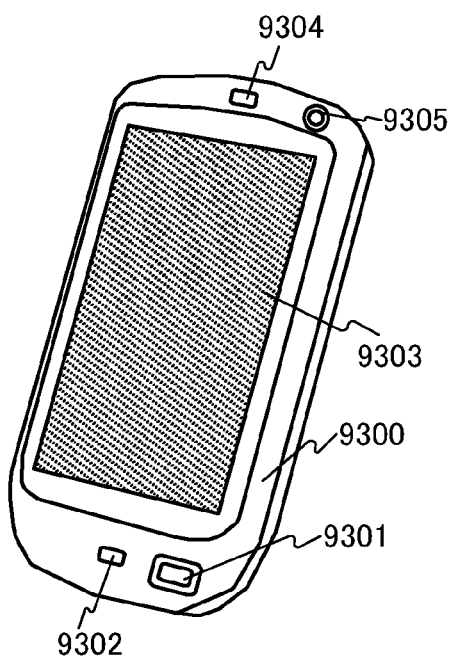
FIGS. 14A to 14D are perspective views each illustrating an example of an electronic device.

FIG. 14A illustrates a portable information terminal. The portable information terminal illustrated in FIG. 14A includes a housing 9300, a button 9301, a microphone 9302, a display portion 9303, a speaker 9304, and a camera 9305, and has a function as a mobile phone.

Figure 14B:
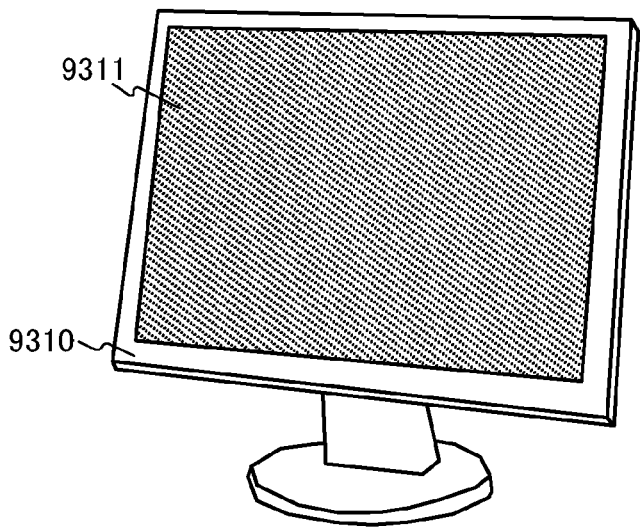

FIG. 14B illustrates a display. The display illustrated in FIG. 14B includes a housing 9310 and a display portion 9311.

Figure 14C:
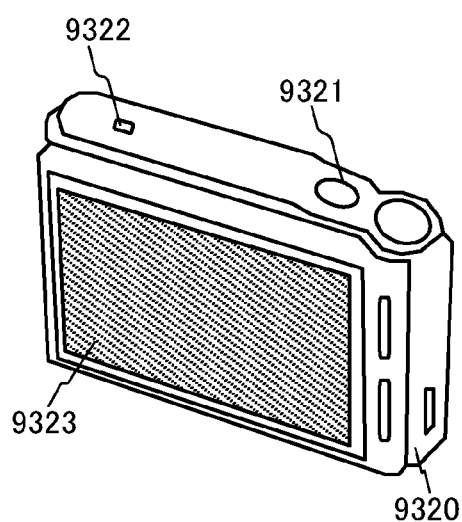

FIG. 14C illustrates a digital still camera. The digital still camera illustrated in FIG. 14C includes a housing 9320, a button 9321, a microphone 9322, and a display portion 9323.

Figure 14D:
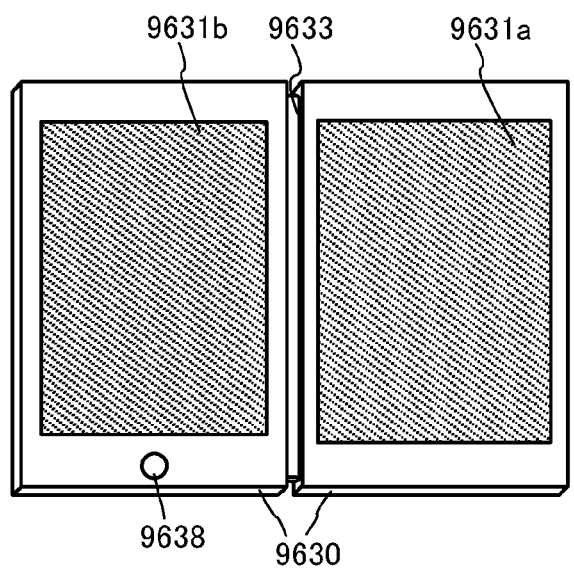

FIG. 14D illustrates a double-foldable portable information terminal. The double-foldable portable information terminal illustrated in FIG. 14D includes a housing 9630, a display portion 9631$a$, a display portion 9631$b$, a hinge 9633, and an operation switch 9638.

Part or whole of the display portion 9631$a$ and/or the display portion 9631$b$ can function as a touch panel. By touching an operation key displayed on the touch panel, a user can input data, for example.

By applying one embodiment of the present invention, the performance of an electronic device can be improved.

Note that the structures, methods, and the like described in this embodiment can be used as appropriate in combination with any of the structures, methods, and the like described in the other embodiments and examples.

EXAMPLE 1

In this example, a concentration distribution of oxygen ions in the depth direction of an oxide semiconductor film or an insulating film is described. In this example, calculation results of a concentration distribution in the case where oxygen ions are injected into an oxide semiconductor film are described.

The conditions given below were used for the calculation of the concentration distribution in this example.
<Structure for Calculation>

As a structure of an injection target for the calculation, a structure including a 20-nm-thick oxide semiconductor film and a 20-nm-thick sacrifice film thereover, which is an oxide semiconductor film formed using the same material as the oxide semiconductor film, is used. In other words, the structure of the injection target for the calculation is the structure having the first region and the second region, which is described in the above embodiment; specifically, the injection target is an oxide semiconductor film having a 20-nm-thick first region and a 20-nm-thick second region.

<Structure of Oxide Semiconductor Film>

The oxide semiconductor film for the calculation is formed using an In—Ga—Zn-based oxide material, and specifically, has a composition of In:Ga:Zn:O=3:1:2:8 (atomic ratio). The density of the oxide semiconductor film is 6.8 g/cm$^3$.

<Oxygen Ion for Calculation>

As the oxygen ion injected into the first region and the second region, an oxygen ion with a mass number of 16 is used.

<Injection Condition of Oxygen Ion>

In the calculation in this example, the oxygen ions are injected under two conditions, Condition A and Condition B. In Condition A, the acceleration voltage is 20 kV and the dose is $1.5 \times 10^{16}$ cm$^{-2}$. In Condition B which is a comparative example, the acceleration voltage is 5 kV and the dose is $5.0 \times 10^{16}$ cm$^{-2}$. The acceleration voltage in Condition A is such an acceleration voltage that the local maximum of the oxygen ion concentration distribution is located in the first region of the oxide semiconductor film as described in the above embodiment. The acceleration voltage in Condition B is set so that the local maximum of the oxygen ion concentration distribution is located in the second region (sacrifice film) of the oxide semiconductor film. In addition, the doses differ between Condition A and Condition B; the doses are selected so that the local maximum of the concentration distribution of oxygen ions injected at the acceleration voltage in Condition A can be equal to the local maximum of the concentration distribution of oxygen ions injected at the acceleration voltage in Condition B.

Figure 15:
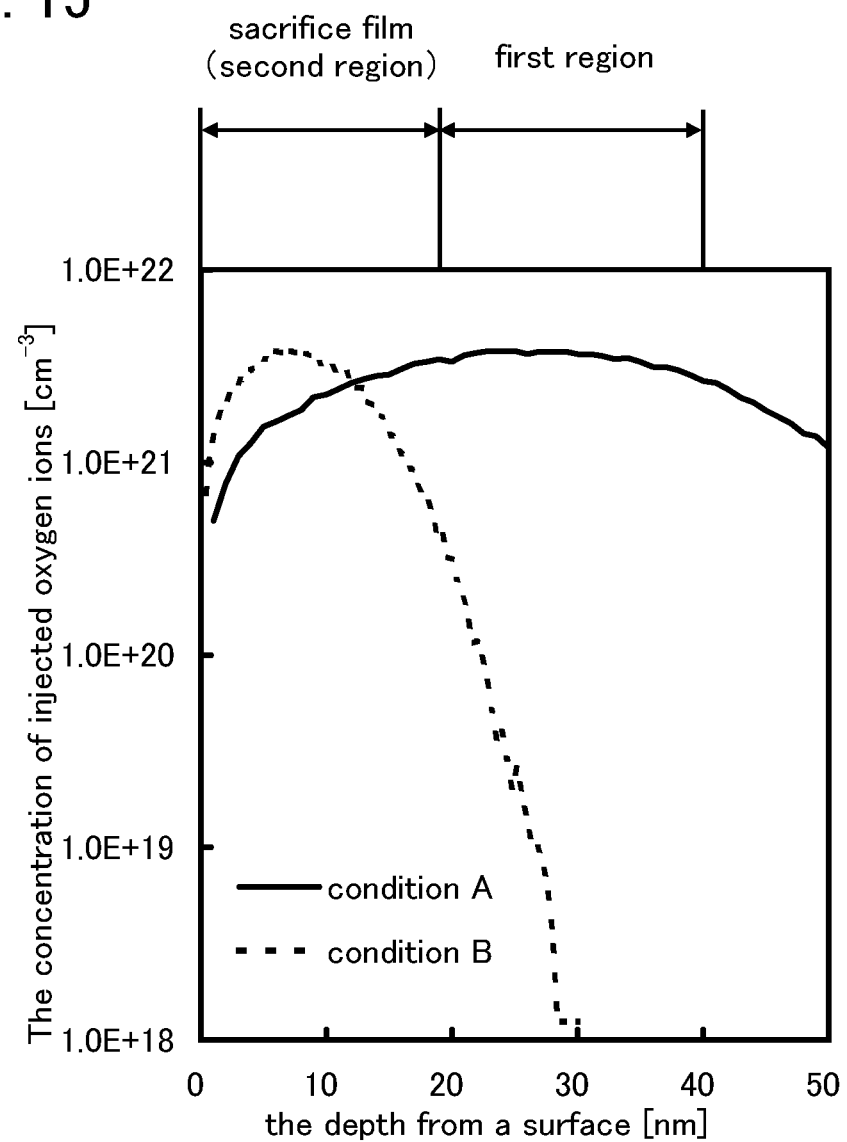
FIG. 15 is a graph showing a calculated oxygen ion concentration distribution in the depth direction of an injection target.

FIG. 15 shows oxygen ion concentration distributions calculated under the above conditions. In FIG. 15, the horizontal axis represents the depth from a surface of the second region (sacrifice film), and the vertical axis represents the concentration of injected oxygen ions.

It is confirmed from FIG. 15 that, under Condition A, the local maximum of the concentration distribution of the injected oxygen ions in the depth direction of the oxide semiconductor film is located in the first region. On the other hand, it is confirmed that, under Condition B, the local maximum of the concentration distribution of the injected oxygen ions is located in the second region (sacrifice film). It is also confirmed that, under Condition A, the amount of change in the concentration distribution of the injected oxygen ions in the depth direction of the oxide semiconductor film is small at least in the first region. Specifically, the largest change in the concentration distribution of the injected oxygen ions in the first region is a 29% drop from the local maximum of the concentration distribution of the injected oxygen ions. Under Condition B, in contrast, the largest change in the concentration distribution of the injected oxygen ions in the second region (sacrifice film) is a 91% drop from the local maximum of the concentration distribution of the injected oxygen ions. The results indicate that oxygen ions can be injected into the oxide semiconductor film (first region, in particular) more uniformly under Condition A than under Condition B.

FIG. 15 also shows that the area of a region under a solid line, which denotes the concentration distribution of the oxygen ions injected under Condition A, in the depth range from 20 nm to 40 nm (total amount of oxygen ions) is larger than the area of a region under a dotted line, which denotes the concentration distribution of the oxygen ions injected under Condition B, in the depth range from 20 nm to 40 nm (total amount of oxygen ions). Accordingly, it can be confirmed that, in the case where the local maximum of the concentration distribution of the oxygen ions injected under Condition A is equal to that under Condition B, injection of oxygen ions at a high acceleration voltage as under Condition A is preferable because the total amount of oxygen ions in a region into which the oxygen ions are intended to be injected can be larger.

The following is indicated by the above results: in the case where oxygen ions are injected into a thin oxide semiconductor film, the oxygen ions can be uniformly injected by forming a sacrifice film over the oxide semiconductor film and injecting the oxygen ions at a high acceleration voltage as in one embodiment of the present invention.

EXAMPLE 2

In this example, a concentration distribution of oxygen ions in the depth direction of an oxide semiconductor film or an insulating film is described. In this example, calculation results of a concentration distribution in the case where oxygen ions are injected into an insulating film are described.

<Structure for Calculation>

As a structure of an injection target for the calculation, a structure including a 200-nm-thick insulating film and a 300-nm-thick sacrifice film thereover, which is an insulating film formed using the same material as the insulating film, is used. In other words, the structure of the injection target for the calculation is the structure having the first region and the second region, which is described in the above embodiment; specifically, the injection target is an insulating film having a 200-nm-thick first region and a 300-nm-thick second region.

<Structure of Insulating Film>

The insulating film for the calculation is formed using silicon oxide, and specifically, is a silicon oxide film having a composition of Si:O=1:2 (atomic ratio). The density of the insulating film is 2.2 g/cm$^3$.

<Oxygen Ion for Calculation>

As the oxygen ion injected into the first region and the second region, an oxygen ion with a mass number of 16 is used.

<Injection Condition of Oxygen Ion>

In the calculation in this example, the oxygen ions are injected under two conditions, Condition C and Condition D. In Condition C, the acceleration voltage is 160 kV and the dose is $1.9 \times 10^{16}$ cm$^{-2}$. In Condition D which is a comparative example, the acceleration voltage is 50 kV and the dose is $1.0 \times 10^{16}$ cm$^{-2}$. The acceleration voltage in Condition C is such an acceleration voltage that the local maximum of the oxygen ion concentration distribution is located in the first region of the insulating film as described in the above embodiment. The acceleration voltage in Condition D is set so that the local maximum of the oxygen ion concentration distribution is located in the second region (sacrifice film) of the insulating film. In addition, the doses differ between Condition C and Condition D; the doses are selected so that the local maximum of the concentration distribution of oxygen ions injected at the acceleration voltage in Condition C can be equal to the local maximum of the concentration distribution of oxygen ions injected at the acceleration voltage in Condition D.

Figure 17:
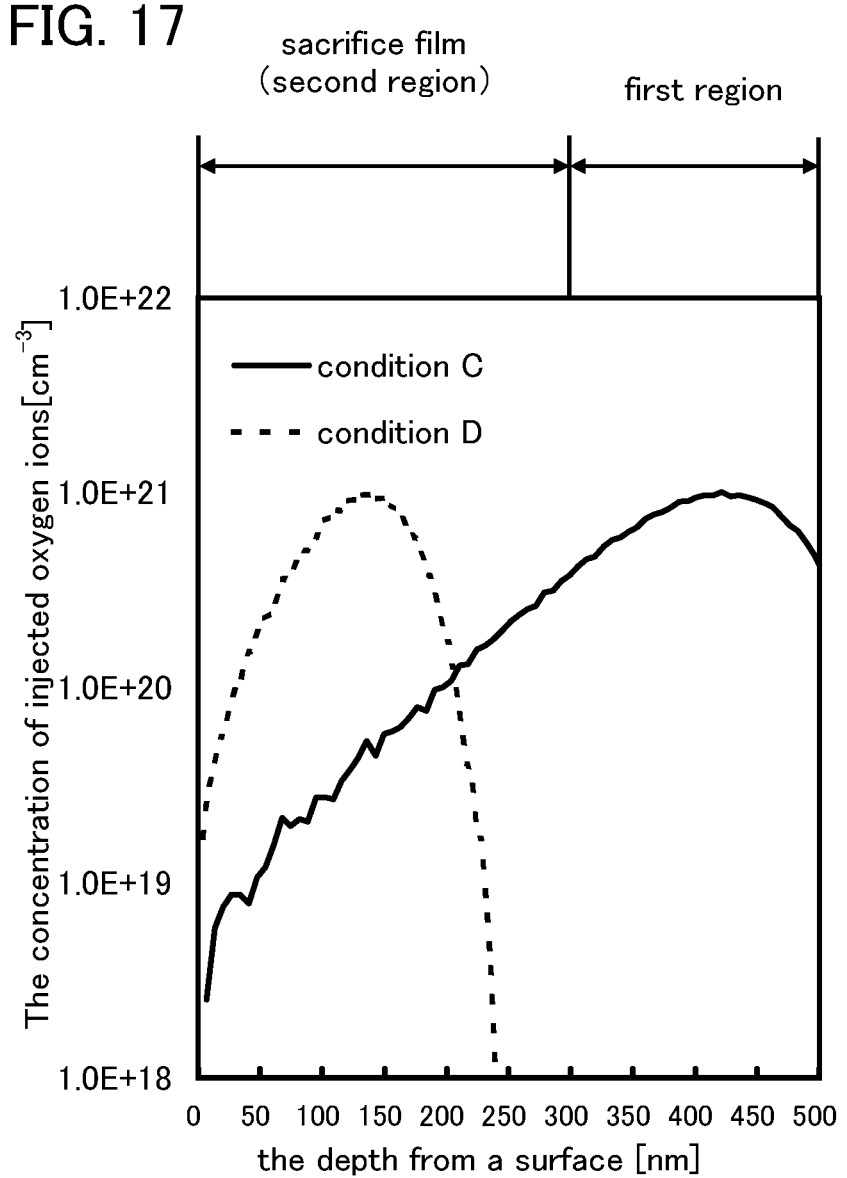
FIG. 17 is a graph showing a calculated oxygen ion concentration distribution in the depth direction of an injection target.

FIG. 17 shows oxygen ion concentration distributions calculated under the above conditions. In FIG. 17, the horizontal axis represents the depth from a surface of the second region (sacrifice film), and the vertical axis represents the concentration of injected oxygen ions.

It is confirmed from FIG. 17 that, under Condition C, the local maximum of the concentration distribution of the injected oxygen ions in the depth direction of the insulating film is located in the first region. On the other hand, it is confirmed that, under Condition D, the local maximum of the concentration distribution of the injected oxygen ions is located in the second region (sacrifice film).

In the case where the method for forming an insulating film described in this example is used in the manufacture of the semiconductor device described in the above embodiment, for example, the second region (sacrifice film) is removed later. Therefore, for the evaluation of the insulating films formed under the two conditions, Condition C and Condition D, the concentration distribution of the oxygen ions injected into the first region is important.

Referring to a curve in the range from 300 nm on the horizontal axis, the result under Condition C in FIG. 17 shows that the oxygen ion concentration at 300 nm on the horizontal axis is approximately 2.5 times lower than the oxygen ion concentration at 400 nm on the horizontal axis. In contrast, the result under Condition D in FIG. 17 shows that the oxygen ion concentration at 0 nm on the horizontal axis is approximately 44 times lower than the oxygen ion concentration at 100 nm on the horizontal axis.

Accordingly, the following can be confirmed: by providing a second region (sacrifice film) over an insulating film and injecting oxygen ions at a high acceleration voltage, the oxygen ions can be uniformly injected into the insulating film as compared with the case where the oxygen ions are directly injected.

The following is indicated by the above results: in the case where oxygen ions are injected into a thin insulating film, the oxygen ions can be uniformly injected into the insulating film by forming a sacrifice film over the insulating film and injecting the oxygen ions at a high acceleration voltage as in one embodiment of the present invention.

EXAMPLE 3

In this example, an effect of the hydrogen concentration of an insulating film containing excess oxygen, which corresponds to the oxide insulating film from which part of oxygen is released by heat treatment described in the above embodiment, upon electrical characteristics of a transistor is described.

Specifically, hydrogen was intentionally added to the insulating film containing excess oxygen, and the hydrogen concentration was evaluated by SIMS.

A method for fabricating samples is described below.

First, a glass substrate was prepared and a 300-nm-thick silicon oxide film was formed over the glass substrate by a sputtering method.

The silicon oxide film was formed using a quartz target at a pressure of 0.4 Pa, a power of 1.5 kW (13.56 MHz), and a substrate temperature of 100° C. during film formation.

Four kinds of samples were prepared. Note that the samples were formed under the same conditions except for the flow rates of an oxygen gas ($O_2$), a deuterium gas ($D_2$), and an argon gas (Ar) which were gases used for the formation of the silicon oxide film.

Table 1 shows sample names, the respective flow rates of the gases used for the formation of the silicon oxide film, and D (deuterium atom) concentrations and H (hydrogen) concentrations in the silicon oxide films at a depth of 30 nm. Note that the $D_2$ proportion in the deposition gas ($D_2/(O_2+Ar+D_2)$) for each of the samples was as follows: 0 vol % for Sample 1; 0.005 vol % for Sample 2; 0.50 vol % for Sample 3; and 2.50 vol % for Sample 4.

TABLE 1

| Sample Name | $O_2$ [sccm] | Ar [sccm] | $D_2$ [sccm] | $D_2$ Proportion | D Concentration [atoms/cm$^3$] | H Concentration [atoms/cm$^3$] |
| --- | --- | --- | --- | --- | --- | --- |
| Sample 1 | 25 | 25 | 0 | 0% | 5.1E+15 | 6.4E+19 |
| Sample 2 | 25 | 24.9975 | 0.0025 | 0.005% | 1.6E+19 | 1.4E+20 |
| Sample 3 | 25 | 24.75 | 0.25 | 0.5% | 5.6E+20 | 7.2E+19 |
| Sample 4 | 25 | 23.75 | 1.25 | 2.5% | 7.2E+20 | 1.9E+19 |

Table 1 shows that the D concentration of the silicon oxide film becomes higher as the $D_2$ proportion in the deposition gas is increased.

Next, transistors were fabricated using Samples 1 to 4 shown in Table 1.

Figure 18A:
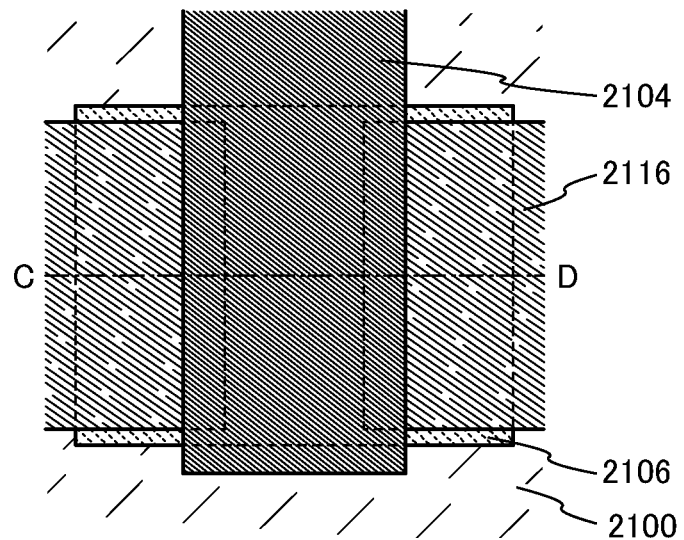
FIGS. 18A and 18B are a top view and a cross-sectional view of a transistor used for evaluation.
Figure 18B:
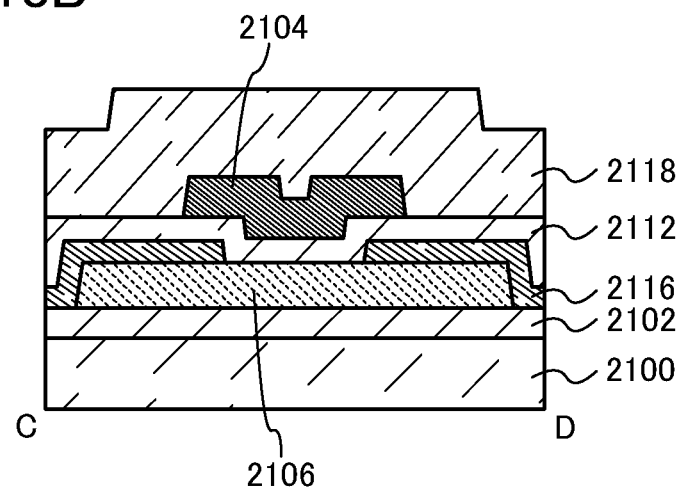

FIG. 18A is a top view of a transistor used for evaluation. FIG. 18B is a cross-sectional view taken along dashed-dotted line C-D in FIG. 18A. Note that a protective insulating film 2118, a gate insulating film 2112, an insulating film 2102, and the like are not illustrated in FIG. 18A for clarity.

The transistor illustrated in FIG. 18B includes a substrate 2100, the insulating film 2102 which is provided over the substrate 2100 and contains excess oxygen, an oxide semiconductor film 2106 provided over the insulating film 2102, a pair of electrodes 2116 provided over the oxide semiconductor film 2106, the gate insulating film 2112 provided to cover the oxide semiconductor film 2106 and the pair of electrodes 2116, a gate electrode 2104 overlapping with the oxide semiconductor film 2106 with the gate insulating film 2112 positioned therebetween, and the protective insulating film 2118 provided over the gate electrode 2104 and the gate insulating film 2112.

Here, any of Samples 1 to 4 shown in Table 1 was used as the insulating film 2102. Note that the thickness of the insulating film 2102 was 300 nm.

In addition, a glass substrate was used as the substrate 2100; a 20-nm-thick IGZO film (formed using a target having a composition of In:Ga:Zn=1:1:1 [atomic ratio]) was used as the oxide semiconductor film 2106; a 100-nm-thick tungsten film was used as the pair of electrodes 2116; a 30-nm-thick silicon oxynitride film was used as the gate insulating film 2112; a stack of a 15-nm-thick tantalum nitride film and a 135-nm-thick tungsten film which were provided in this order from the gate insulating film 2112 side was used as the gate electrode 2104; and a 300-nm-thick silicon oxynitride film was used as the protective insulating film 2118.

The transistor having the above structure was subjected to a BT stress test. Note that, in the transistor used for the measurement, the channel length (L) was 10 μm, the channel width (W) was 10 μm, and the length (Lov) of a portion where the gate electrode 2104 overlaps with each of the pair of electrodes 2116 was 1 μm (2 μm in total). A method of the BT stress test is described below.

First, a drain current (Id) of the transistor was evaluated under the conditions where the substrate temperature was 25° C., the drain voltage (Vd) was 3 V, and the gate voltage (Vg) was swept from −6 V to 6 V. Characteristics of the transistor at this time are referred to as characteristics of the transistor obtained before the BT stress test.

Next, Vd and Vg were set to 0.1 V and −6 V, respectively, the substrate temperature was set to 150° C., and these conditions were kept for one hour.

Next, the applications of Vd and Vg and heating were stopped. Then, Id was evaluated under the conditions where the substrate temperature was 25° C., Vd was 3 V, and Vg was swept from −6 V to 6 V. Characteristics of the transistor at this time are referred to as characteristics of the transistor obtained after the BT stress test.

Table 2 shows the threshold voltage (Vth) and the field-effect mobility ($\mu_{FE}$) before and after the BT stress test. Note that sample names in Table 2 correspond to those in Table 1, and the above description can be referred to for the formation conditions of the insulating film 2102.

TABLE 2

| Sample Name | Before BT Stress | | TestAfter BT Stress Test | |
|---|---|---|---|---|
| | Vth [V] | $\mu_E$ [cm$^2$/Vs] | Vth [V] | $\mu_{FE}$ [cm$^2$/Vs] |
| Sample 1 | 0.94 | 8.6 | 1.17 | 7.8 |
| Sample 2 | 0.82 | 8.6 | 1.03 | 8.2 |
| Sample 3 | 0.89 | 8.8 | 1.05 | 7.8 |
| Sample 4 | 0.71 | 8.7 | 0.43 | 2.5 |

Table 2 shows that $\mu_{FE}$ of Sample 4 is largely lowered after the BT stress test.

Further, characteristics of transistors having smaller L were evaluated. As a result, variation in Vth in the negative direction was larger in Sample 4 than in the other Samples.

As described above, a transistor in which a silicon oxide film is in contact with an oxide semiconductor film has abnormal characteristics when the D concentration of the silicon oxide film is $7.2 \times 10^{20}$ atoms/cm$^3$.

As the results indicate, in the case where the hydrogen concentration of an insulating film containing excess oxygen is higher than or equal to $7.2 \times 10^{20}$ atoms/cm$^3$, variation in initial characteristics of a transistor is increased, a channel length (L) dependence is increased, and the transistor significantly deteriorates owing to a BT stress test; therefore, the hydrogen concentration of the insulating film containing excess oxygen is lower than $7.2 \times 10^{20}$ atoms/cm$^3$. In other words, in one embodiment of the present invention, the hydrogen concentration of an oxide semiconductor film is preferably lower than $5 \times 10^{18}$ atoms/cm$^3$, and the hydrogen concentration of an insulating film containing excess oxygen is preferably lower than $7.2 \times 10^{20}$ atoms/cm$^3$.

The above results indicate that a high hydrogen concentration of an insulating film containing excess oxygen, which is an oxide insulating film from which part of oxygen is released by heat treatment, leads to deterioration in electrical characteristics of a transistor.

This application is based on Japanese Patent Application serial no. 2011-262636 filed with the Japan Patent Office on Nov. 30, 2011, the entire contents of which are hereby incorporated by reference.

What is claimed is:

1. A method for forming an oxide semiconductor film comprising the steps of:
    forming an oxide semiconductor film over a substrate;
    forming a sacrifice film over the oxide semiconductor film;
    injecting oxygen ions into the oxide semiconductor film through the sacrifice film; and
    completely removing the sacrifice film after injecting oxygen ions into the oxide semiconductor film,
    wherein the sacrifice film is formed using the same material as the oxide semiconductor film.

2. The method for forming an oxide semiconductor film according to claim 1,
    wherein the oxide semiconductor film is formed to a thickness greater than or equal to 5 nm and less than or equal to 50 nm, and
    wherein the sacrifice film is formed to a thickness greater than or equal to 20 nm and less than or equal to 500 nm.

3. The method for forming an oxide semiconductor film according to claim 1,
    wherein the oxygen ions are injected so that an amount of change in a concentration distribution of injected oxygen ions in a depth direction of the oxide semiconductor film is 40% or less on the basis of a concentration at a local maximum of the concentration distribution of the injected oxygen ions.

4. The method for forming an oxide semiconductor film according to claim 1,
    wherein the sacrifice film is removed by any one of wet etching, dry etching, and chemical mechanical polishing.

5. The method for forming an oxide semiconductor film according to claim 1,
    wherein the sacrifice film has such a thickness that a local maximum of a concentration distribution of the oxygen ions injected into the oxide semiconductor film in a depth direction of the oxide semiconductor film is located in a region from an interface between the substrate and the oxide semiconductor film to a surface of the oxide semiconductor film, and
    wherein oxygen ions are injected into the oxide semiconductor film at such an acceleration voltage that the local maximum of the concentration distribution of injected oxygen ions in the depth direction of the oxide semiconductor film is located in the region.

6. The method for forming an oxide semiconductor film according to claim 1,
    wherein oxygen ions are injected by an ion implantation method or an ion doping method.

7. A method for manufacturing a semiconductor device comprising the steps of:
    forming an oxide semiconductor film over a substrate having an insulating surface;
    forming a sacrifice film over the oxide semiconductor film;
    injecting oxygen ions into the oxide semiconductor film through the sacrifice film;
    removing the sacrifice film after injecting oxygen ions into the oxide semiconductor film;
    forming an island-shaped oxide semiconductor film by processing the oxide semiconductor film into which the oxygen ions are injected;
    forming a gate insulating film over the island-shaped oxide semiconductor film;
    forming a gate electrode over the gate insulating film so as to overlap with the island-shaped oxide semiconductor film with the gate insulating film positioned between the gate electrode and the island-shaped oxide semiconductor film;

partly exposing the island-shaped oxide semiconductor film by processing the gate insulating film; and forming a source electrode and a drain electrode over the partly exposed island-shaped oxide semiconductor film, wherein the sacrifice film is formed using the same material as the oxide semiconductor film.

8. The method for manufacturing a semiconductor device according to claim 7, wherein the oxide semiconductor film formed over the substrate having the insulating surface is formed to a thickness greater than or equal to 5 nm and less than or equal to 50 nm, and wherein the sacrifice film is formed to a thickness greater than or equal to 20 nm and less than or equal to 500 nm.

9. The method for manufacturing a semiconductor device according to claim 7, wherein the oxygen ions are injected so that an amount of change in a concentration distribution of injected oxygen ions in a depth direction of the oxide semiconductor film is 40% or less on the basis of a concentration at a local maximum of the concentration distribution of the injected oxygen ions.

10. The method for manufacturing a semiconductor device according to claim 7, wherein the sacrifice film is removed by any one of wet etching, dry etching, and chemical mechanical polishing.

11. The method for manufacturing a semiconductor device according to claim 7, further comprising the steps of:

forming a base insulating film over the substrate, and performing heat treatment after forming the gate insulating film so that oxygen is diffused into a region from an interface between the base insulating film and the oxide semiconductor film to a surface of the oxide semiconductor film, wherein either or both of the gate insulating film and the base insulating film is formed using an oxide insulating film from which part of oxygen is released by heat treatment.

12. The method for manufacturing a semiconductor device according to claim 7, wherein the sacrifice film has such a thickness that a local maximum of a concentration distribution of the oxygen ions injected into the oxide semiconductor film in a depth direction of the oxide semiconductor film is located in a region from an interface between the substrate and the oxide semiconductor film to a surface of the oxide semiconductor film, and wherein oxygen ions are injected into the oxide semiconductor film at such an acceleration voltage that the local maximum of the concentration distribution of injected oxygen ions in the depth direction of the oxide semiconductor film is located in the region.

13. The method for forming an oxide semiconductor film according to claim 7, wherein oxygen ions are injected by an ion implantation method or an ion doping method.

\* \* \* \* \*